United States Patent [19]

Kasai

[11] Patent Number: 5,049,834
[45] Date of Patent: Sep. 17, 1991

[54] AMPLIFIER HAVING A CONSTANT-CURRENT BIAS CIRCUIT

[76] Inventor: Takafumi Kasai, 13-28, Higashi-cho 4-chome, Koganei-shi, Tokyo, Japan, 184

[21] Appl. No.: 496,768

[22] Filed: Mar. 21, 1990

Related U.S. Application Data

[63] Continuation-in-part of Ser. No. 243,337, Jun. 23, 1988, Pat. No. 4,933,645.

[30] Foreign Application Priority Data

Nov. 21, 1986 [JP] Japan .................................. 61-276474

[51] Int. Cl.$^5$ .............................................. H03F 3/30
[52] U.S. Cl. ...................................... 330/255; 330/264; 330/265; 330/268
[58] Field of Search ............... 330/255, 264, 265, 267, 330/268, 270, 273, 274

[56] References Cited

U.S. PATENT DOCUMENTS 4,384,261 5/1983 Yokoyama .......................... 330/267

Primary Examiner—James B. Mullins
Attorney, Agent, or Firm—Darby & Darby

[57] ABSTRACT

An amplifier having an input stage with inverting and non-inverting input terminals, a voltage amplifier stage with relay terminals and being operatively connected to the input stage, a SEPP output stage with transistors and an output terminal, and a constant-current bias circuit between the relay terminals for absorbing current bypassing between the relay terminals. The transistors are connected to the output terminal via resistors. The constant-current bias circuit is free of being in direct connection with the output terminal. The amplifier is incorporated in place of an emitter follower in a compact disc player or laser video player and may be incorporated into a driver of a loudspeaker, a magneto-optical recording system or a magnetic disc system for mass storage.

25 Claims, 13 Drawing Sheets

AMPLIFIER HAVING A CONSTANT-CURRENT BIAS CIRCUIT

CROSS-REFERENCE TO COPENDING APPLICATIONS

This is a continuation-in-part of U.S. Ser. No. 243,337, filed Jun. 23, 1988, now U.S. Pat. No. 4,933,645.

FIELD OF THE INVENTION

The present invention relates to an amplifier having a constant-current bias (CCB) circuit comprising an input stage, a voltage amplifier stage and a SEPP output stage having at least one pair of complementary transistors, in which a bypass current, which is obtained by subtracting a control current flowing between bases or gates of the transistors of the output stage from the current supplied to first and second relay terminals of the voltage amplifier stage, i.e., the current bypassing between these relay terminals, is absorbed by a voltage-controlled constant-current bias circuit. Therefore, the voltage appearing between two resistors each directly connected to an output terminal is integrated and then negatively fed back to the constant-current bias circuit, thereby to determine the bias of the SEPP output stage.

BACKGROUND OF THE INVENTION

A conventional amplifier comprises, as shown in FIG. 1 for example, an input stage 10, a voltage amplifier stage 20 and a SEPP (Single Ended Push-Pull) output stage 30.

The input stage 10 includes a pair of FETs 11 and 12 of monolithic IC, an input terminal 13 connected to the gate of FET 11, an input resistor 14 connected between input terminal 13 and the ground, a resistor 15 connected between the common source of FETs 11 and 12 and a negative power supply $-V_{cc}$, and resistors 16 and 17 which are connected between a positive power supply $+V_{cc}$ and the respective drain of FETs 11 and 12. The gate of FET 12 to the ground and the output terminal are connected negative feedback resistors 18 and 19 which determine the gain or amplification factor of the amplifier.

The voltage amplifier stage 20 includes PNP transistors 21 and 22 each having a base connected to the drain of FETs 11 and 12, respectively, a resistor 23 connected between the common emitter of PNP transistors 21 and 22 and the positive power supply $+V_{cc}$, an NPN transistor 24 having a collector and a base which are connected to the collector of PNP transistor 22, and an NPN transistor 25 having a base connected to the collector of PNP transistor 22. These NPN transistors 24 and 25 have emitters each connected to the negative power supply $-V_{cc}$. The absolute value of the collector current of PNP transistor 22 is substantially equal to that of NPN transistor 25. The collector of PNP transistor 22 provides a first relay terminal $I_1$ while the collector of NPN transistor 25 provides a second relay terminal $I_2$.

The SEPP output stage 30 has Darlington-connected NPN transistors 31 and 32 each having a collector connected to the positive power supply $+V_{cc}$, Darlington-connected PNP transistors 33 and 34 each having a collector connected to the negative power supply $-V_{cc}$, an output terminal 35, a first resistor 36 directly connected to output terminal 35 and connected to the emitter of NPN transistor 32, and a second resistor 37 directly connected to output terminal 35 and connected to the emitter of PNP transistor 34. The junction between the emitter of NPN transistor 31 and the base of NPN transistor 32 is connected to output terminal 35 via resistor 38, while the junction between the emitter of PNP transistor 33 and the base of PNP transistor 34 is connected to output terminal 35 via resistor 39. The constant-voltage bias (CVB) circuit 26 is connected between first relay terminal $I_1$ connected to the base (or gate) of NPN transistor 31 and second relay terminal $I_2$ connected to the base (or gate) of PNP transistor 33.

The bias circuit 26 includes a temperature-compensation NPN transistor 27 having a collector connected to the base of NPN transistor 31 and an emitter connected to the base of PNP transistor 32, a variable resistor 28 connected between the bases of NPN transistors 31 and 27, and a fixed resistor 29 connected between the bases of NPN transistor 27 and PNP transistor 33. The idle current flowing between collectors of NPN transistor 32 and PNP transistor 34 is regulated to class AB through adjustment of variable resistor 28. The voltage between the collector and the emitter of NPN transistor 27 has a value which is obtained by adding the resistances of variable resistor 28 and that of the fixed resistor 29 to produce a sum value, dividing the sum value by that of fixed resistor 29, and multiplying the quotient with the base-emitter voltage $V_{be}$ across NPN transistor 27.

In the conventional CVB circuit 26, since the voltage $V_{be}$ is substantially constant, the bias voltage between the first and second relay terminals is maintained constant.

In the operation of this class AB amplifier, for example, when NPN transistors 31 and 32 are driven to the plus voltage side, PNP transistors 33 and 34 are also driven to the plus voltage side through the CVB circuit. More specifically, an increase in the base currents of NPN transistors 31 and 32 causes the collector currents to increase correspondingly, as well as the respective base to emitter voltage $V_{be}$ of NPN transistors 31 and 32. The voltage across first resistor 36 also increases as a result of the increase in the collector current. In consequence, since the voltage between the collector and the emitter of NPN transistor 27 is substantially constant, the voltage applied between the emitters and the bases of PNP transistors 33 and 34 are reduced to turn off PNP transistors 33 and 34.

In general, bipolar transistors such as NPN or PNP transistors require a certain transition time for transisting from the "off" state to the "on" state, in order to charge up the holes or the electron carriers. Thus the charging time causes an unfavorable effect on the characteristics of the amplifier.

The PNP transistors 33 and 34 require, when driven to the minus voltage side from the completely "off" state, carrier currents for charging electrons in the transistors in addition to the base current components proportional to the ordinary collector currents. The carrier currents adversely affect the non-feedback characteristics of the amplifier. When the amplifier is connected to an inductive load such as a loudspeaker, the carrier currents cause unfavorable effects on the output such as the quality of the sound, due to time lag in the switching between "on" and "off" states of NPN transistors 31 and 32 and PNP transistors 33 and 34. In consequence, the conventional amplifier of class AB has suffered from a problem in that the quality of the sound is impaired to a degree which is not measurable by ordinary measuring instrument, due to the use of the CVB circuit.

SUMMARY OF THE INVENTION

Accordingly, an object of the invention is to provide an amplifier in which problems attributable to the carrier current is overcome by virtue of the use of a constant-current bias (CCB) circuit.

This CCB circuit, when used in an embodiment implemented to a commercial amplifier of class AB or B, provides a remarkable improvement in the quality of the sound as compared to that before improvement, but makes its adjustment difficult as compared with the known constant-voltage bias arrangement.

The control voltage of a voltage-controlled feedback-type CCB circuit is determined by a negative feedback circuit from a mean value of a voltage generated between the emitter resistors for the power transistors, i.e., between the first and second resistors.

According to the present invention, there is provided an amplifier wherein the SEPP output stage comprises a first transistor, a second transistor having a polarity opposite to the first transistor, an output terminal, a first resistor directly connected to the output terminal and connected to the emitter or source of the first transistor, and a second resistor connected directly to the output terminal and connected to the emitter or source of the second transistor. The CCB circuit controls the current value by a voltage applied to terminals $C_1$ and $C_2$, the CCB circuit being adapted to receive, through an integration circuit, another voltage which appears at both ends of the first and second resistors so as to control the level of the current bypassing between the first and second relay terminals, thereby controlling the bias current flowing in the first and second resistors.

The amplifier of the class AB incorporating the CCB circuit has to be designed in due consideration of the temperature characteristics of the constituent elements such as bipolar or field effect transistors (FETs) and resistors. The CCB circuit itself has also a temperature characteristics. The AS$\theta$ region of the power transistor used in the output stage also has to be taken into consideration.

Thus, the present invention proposes two types of basic circuits making use of CCB circuits.

In the first basic circuit, the operation temperature range of the amplifier is set to fall within the range between 0° and 70° C., and the basic value A of the bias current in this temperature range, as well as fluctuation width B or (A±B), is determined. Subsequently, the basic value C of the current passing the CCB circuit, as well as the fluctuation width D or (C±D) is determined and the set value of the electric current in the CCB circuit is determined to meet the condition of (C+D)≦A, and the remainder bypass current is absorbed by a CVB circuit whose internal resistance is increased to a level which is about (A−B)/B times as high as that of the conventional CVB circuit. All the values A, B, C and D are positive.

In the second basic circuit, the basic value A of the bypass current in the operation temperature range 0° to 70° C. of the amplifier, as well as the fluctuation width B or (A±B), is determined, and a CCB circuit is used which enables the current value to be controlled through a control of voltage over a current range which can completely cover the fluctuation width B. Therefore, the CCB circuit connected between the first and second relay terminals receives, through an integration circuit, the voltage which appears across the output resistor connected to the output terminal, whereby a negative feedback is effected to stabilize the idle current of the power transistor of the output stage. The integration circuit eliminates a low-frequency component of, for example, 20 Hz or higher flowing through the output resistor. According to the present invention, therefore, the matching between the transistors of the driving stage and the transistors of the SEPP output stage can be attained by a simple adding or subtracting of currents, and the turning of the non-driven transistor of the SEPP output stage to "off" state is prevented, by virtue of the fact that the bias circuit incorporates a constant-current circuit, integration circuit and the negative feedback control technique.

For a better understanding of the present invention, reference is made to the following description and accompanying drawings, while the scope of the invention is set forth in the appended claims.

DESCRIPTION OF THE PREFERRED EMBODIMENTS

The invention will be described in more detail through preferred embodiments with reference to the accompanying drawings.

Figure 1:
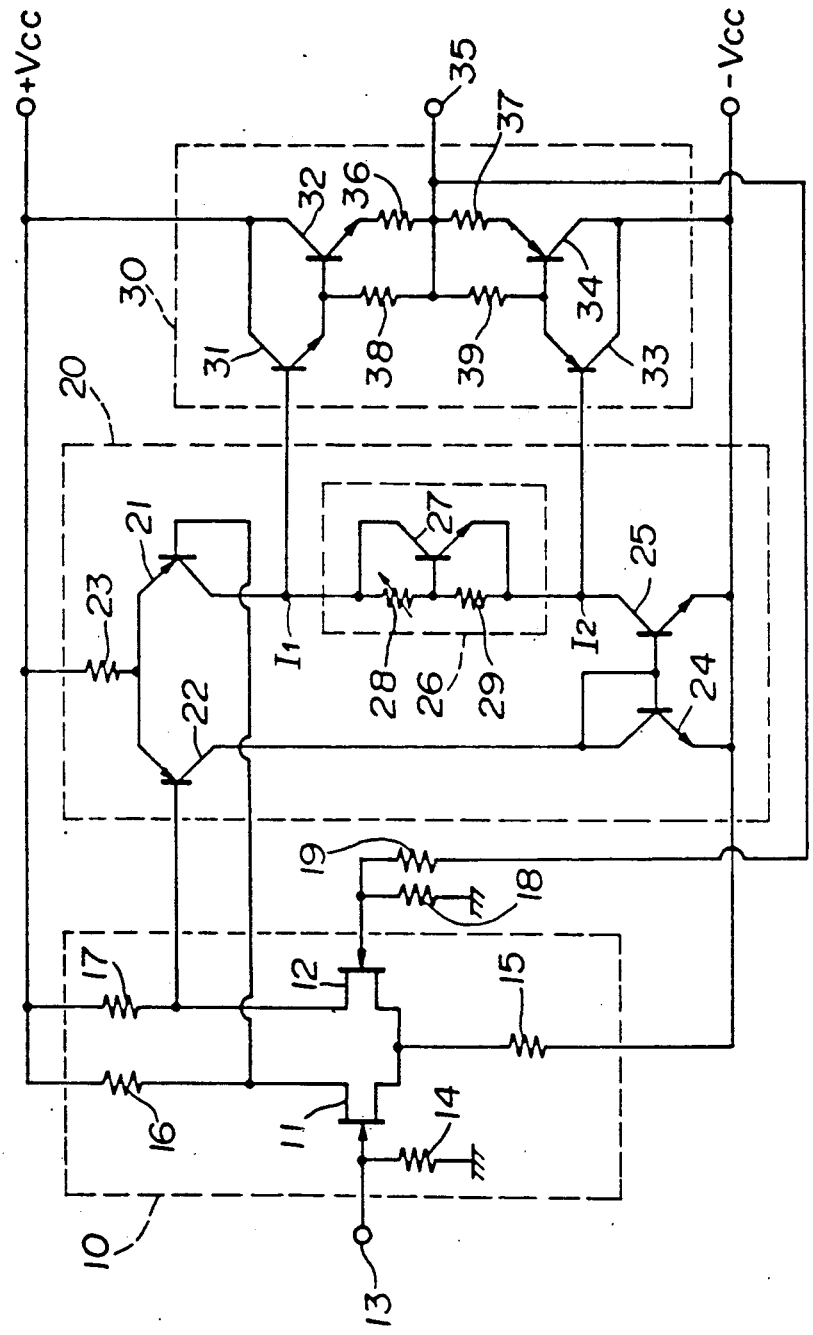
FIG. 1 is a circuit diagram of a conventional class AB amplifier.
Figure 2:
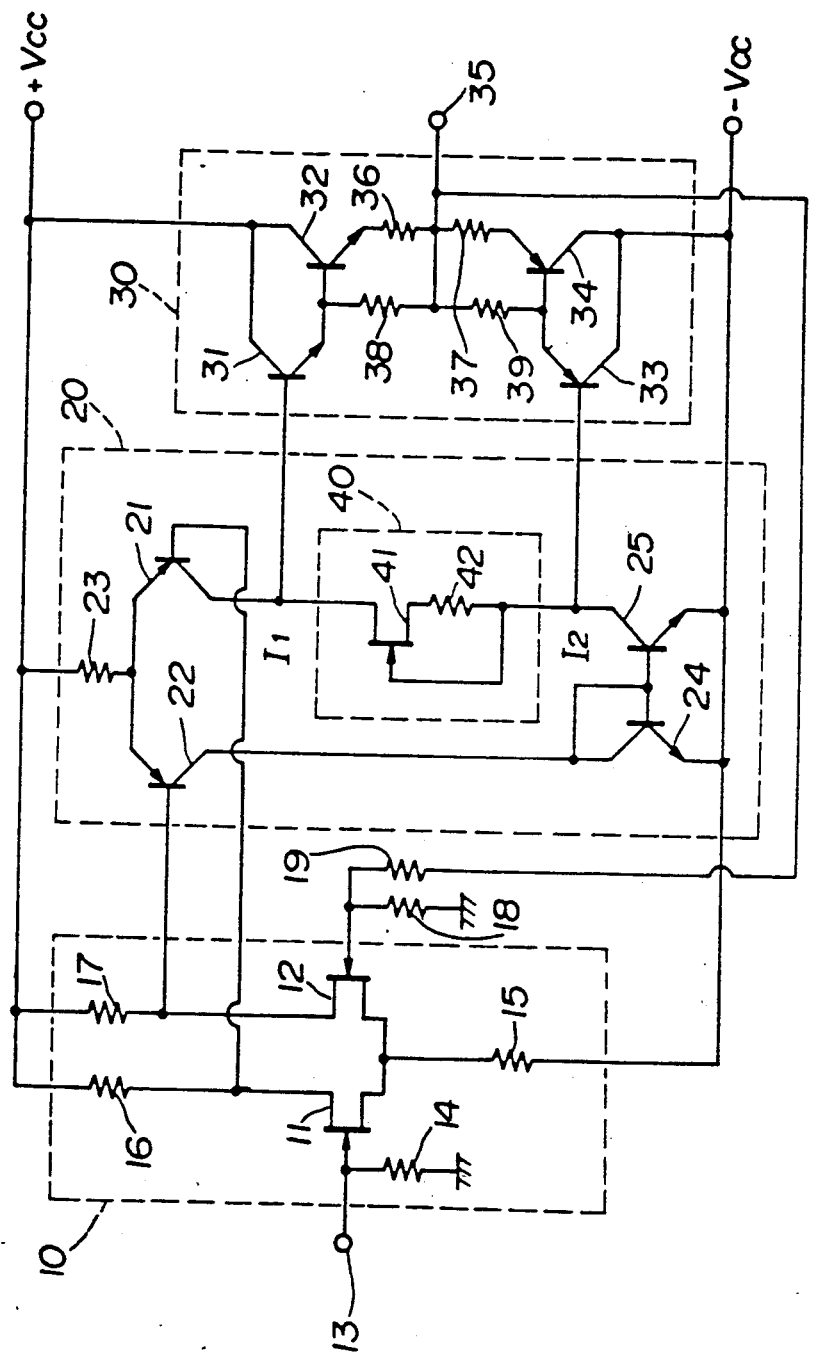
FIG. 2 is a basic circuit diagram of an amplifier provided with a CCB circuit.

FIG. 2 shows a basic circuit of an amplifier constructed in accordance with the present invention. In this drawing, the same reference numerals are used to denote the same parts or members as those used FIG. 1, and detailed description thereof is omitted.

As will be clearly understood from the comparison with the conventional amplifier shown in FIG. 1, the amplifier in accordance with the present invention has a CCB circuit 40 in place of CVB circuit 26. The CCB circuit 40 is composed of, for example, a junction-type N-channel FET 41 having a drain connected to first relay terminal $I_1$ and a resistor 42 connected to the source of FET 41 and second relay terminal $I_2$. The gate of FET 41 is connected to second relay terminal $I_2$. The CCB circuit 40 may be for example substituted by a constant-current diode. It will also be clear that a similar circuit arrangement can be obtained by the use of a P-channel FET in place of the N-channel FET.

Figure 3:
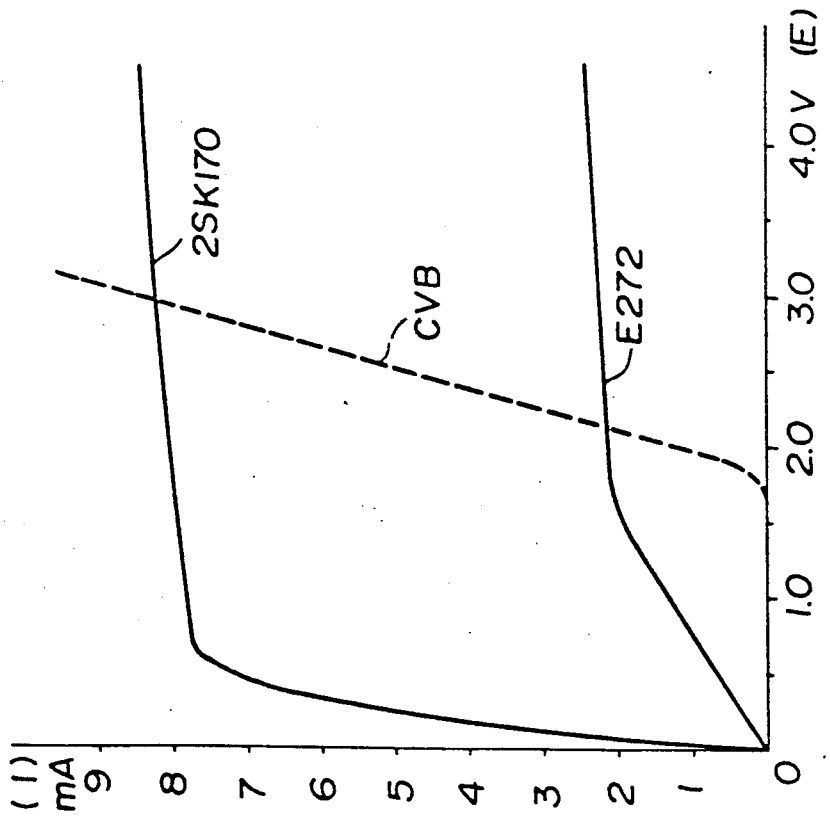
FIG. 3 is a graph showing the voltage vs. current characteristics of a constant-current element, CCB circuit and a CVB circuit.

FIG. 3 shows typical current vs. voltage characteristics of an N-channel FET commercially available under the type of 2SK170 as obtained under the condition of Vgs=0 V, as well as typical current vs. voltage characteristics of a constant-current diode commercially available under the type of E272. This FET exhibits such a characteristic that the current abruptly rises such as for a resistor, when the drain-source voltage ranges between 0 and 0.5 V. While, when the drain-source voltage exceeds about 0.5 V, the current starts to gradually increase from the level of 8 mA, thus exhibiting a substantially constant current level, i.e., a constant-current characteristic. Alternatively, the constant-current diode has a transition voltage around about 1.5 V, across which the characteristic is changed from resistance to a constant-current characteristic. From FIG. 3, it will be clear that the characteristic of the CCB circuit according to the present invention is different from that of the conventional CVB circuit shown by the broken line in FIG. 3.

Figure 4:
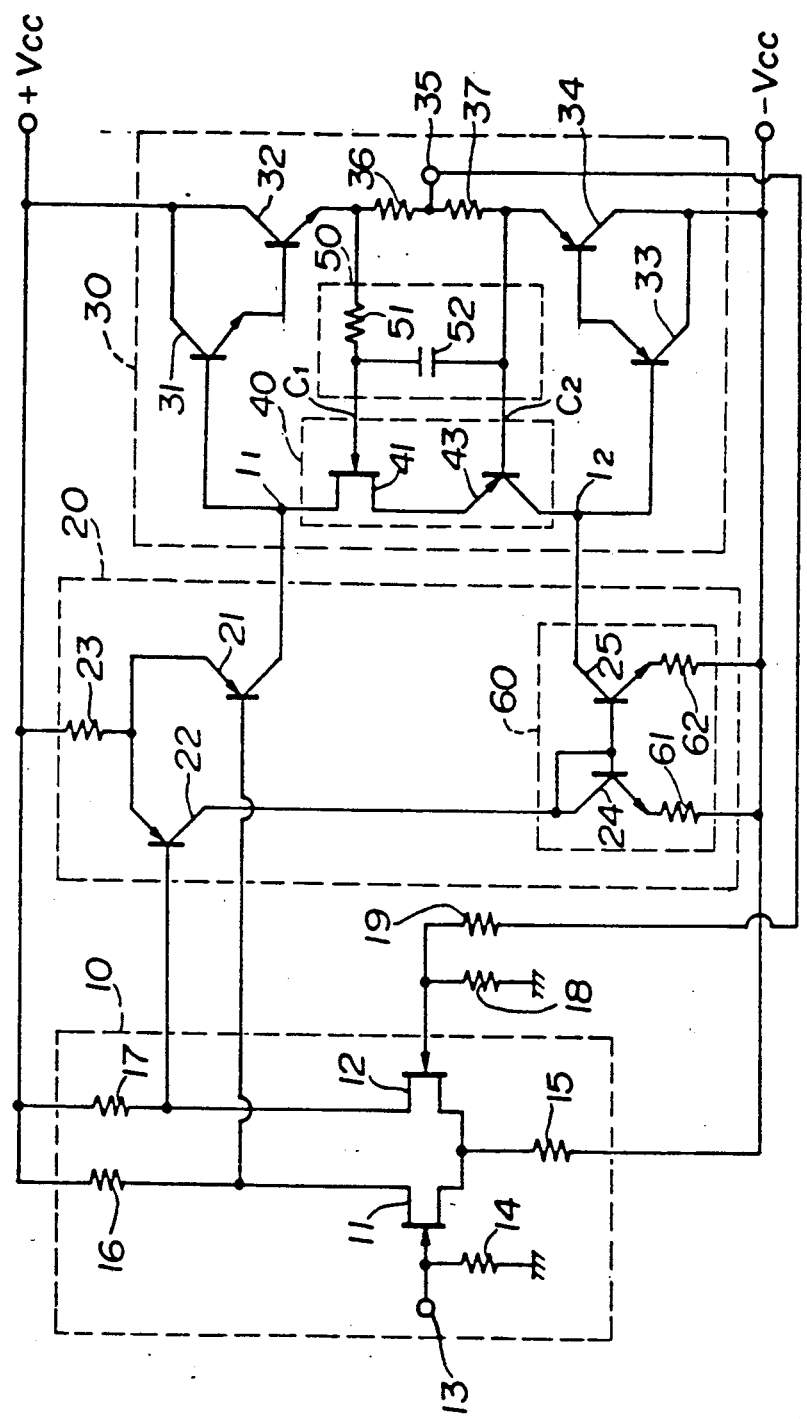
FIG. 4 is a circuit diagram of an embodiment of the amplifier in accordance with the present invention.

FIG. 4 is a circuit diagram of an amplifier according to the present invention comprising negative feedback type CCB circuit. This amplifier comprises a differential input stage 10, a voltage amplifier stage 20 and a complementary SEPP output stage 30.

The differential input stage 10 includes, for example, a dual FET IC composed of a pair of FETs 11 and 12 which are integrated on single substrate taking into account the heat equilibrium, an input terminal 13 connected to the gate of FET 11, an input resistor 14 connected between input terminal 13 and the ground, a resistor 15 connected between the common source of FETs 11 and 12 and a negative power supply $-Vcc$, and resistors 16 and 17 connected between a positive power supply $+Vcc$ and the respective drain of FETs 11 and 12. The gate of FET 12 to the ground and the output terminal are connected negative feedback resistors 18 and 19 which determine the gain of the amplifier.

The voltage amplifier stage 20 includes a PNP transistor 21 having a base connected to the drain of FET 11, a PNP transistor 22 having a base connected to the drain of FET 12, a resistor 23 connected between the common emitter of PNP transistors 21 and 22 and the positive power supply $+Vcc$, and a current mirror circuit 60 connected to the negative power supply $-Vcc$. The current mirror circuit 60 is designed to provide the collector current of NPN transistor 25 whose absolute value is same as that of PNP transistor 22. Therefore, NPN transistor 24 having a base and a collector connected to PNP transistor 22 has an emitter connected via resistor 61 to the negative power supply $-Vcc$. The NPN transistor 25 having a base connected to the base of NPN transistor 24 has an emitter connected to the negative power supply $-Vcc$ via resistor 62 having the same resistance value as that of resistor 61. The collector of PNP transistor 22 provides first relay terminal $I_1$ while the collector of NPN transistor 25 provides second relay terminal $I_2$ of the voltage amplifier stage 20.

The SEPP output stage, which includes the CCB circuit 40 according to the present invention, is connected between first and second relay terminals $I_1$ and $I_2$.

The SEPP output stage 30 has Darlington-connected NPN transistors 31 and 32 each having a collector connected to the positive power supply $+Vcc$, Darlington-connected PNP transistors 33 and 34 each having a collector connected to the negative power supply $-Vcc$, an output terminal 35, a first resistor 36 directly connected to output terminal 35 and connected to the emitter of NPN transistor 32, and a second resistor 37 directly connected to output terminal 35 and connected to the emitter of PNP transistor 34. The junction between the emitter of NPN transistor 31 and the base of NPN transistor 32 may be connected to the junction between the emitter of PNP transistor 33 and the base of PNP transistor 34, via a constant current element.

The CCB circuit 40 is connected between first relay terminal $I_1$ connected to the base of NPN transistor 31 and second relay terminal $I_2$ connected to the base of PNP transistor 33. The CCB circuit 40 receives, via the integration circuit 50, the voltage which appears between one end of output resistor 36 and other end of output resistor 37. The integration circuit 50 includes a resistor 51 connected to one end of output resistor 36 and a capacitor 52 connected between other ends of resistor 51 and output resistor 37. For instance, the integration circuit 50 constitutes a primary high-cut filter of 6 db/octave, having a cutoff frequency of 20 Hz. The CCB circuit 40 includes an N-channel junction type FET 41 having a drain connected both to the collector of PNP transistor 21 and the base of NPN transistor 31, and a PNP transistor 43 cascade-connected to FET 41, i.e., having an emitter connected to the source of FET 41. The PNP transistor 43 has a collector connected both to the collector of NPN transistor 25 and the base of PNP transistor 33. The cascade-connected FET 41 and PNP transistor 43 provide a collector current or a drain current which is adjusted by the control voltage applied between the gate of FET 41 or $C_1$ and the base of PNP transistor 43 or $C_2$. Thus, when the control voltage between the gate and the base (or $C_1$ and $C_2$) is constant, the collector current or a drain current is maintained substantially constant even if a voltage between the first and second relay terminals I₁ and I₂ is variable.

A description will be given hereinafter as to the operation of the class AB amplifier of the present invention incorporating the CCB circuit. It is assumed that the composite current amplification factors (collector current/base current) of the respective pairs, i.e., NPN transistors 31 and 32 and PNP transistors 33 and 34 are 1,000. The idling current of NPN transistors 31 and 32 and PNP transistors 33 and 34 in case of no input signal is assumed to be 50 mA. The collector currents of PNP and NPN transistors are assumed to be 5 mA respectively. Since the above-mentioned idle current can be driven with base current of 0.05 mA of NPN and PNP transistors 31 and 34, a bias current of 4.95 mA flows in constant-current circuit 40. The current is set by the voltage which appears between first and second output resistors 36 and 37, for example, 0.1 V.

It is assumed here that a positive signal is applied to input terminal 13 so as to produce a collector current of 5.5 mA in PNP transistor 21. In such a case, a collector current of about 4.5 mA is produced in PNP transistor so that the collector current of NPN transistor 25 of the current mirror circuit 60 is reduced to about 4.5 mA. As a result, the base current of NPN transistor 31 is reduced to 1.05 mA, whereby a positive current of 1.05 A is derived from output terminal 35.

On the other hand, the sum of the drain current of constant-current circuit 40 and the base current of PNP transistor 34 is approximately 4.5 mA. The ratio of the currents shared by the drain current and the base current depends on the base voltage of NPN transistor 31, output voltage and the base voltage of PNP transistor 34. In this case, PNP transistors 33 and 34 are not turned off.

According to the present invention, the drawbacks of the bipolar transistors used in the SEPP output stage are eliminated by the use of the CCB circuit whose current is controlled by voltage. The term "transistor" is used here to include PNP and NPN transistors which are arranged in Darlington and inverted-Darlington connections.

Figure 5:
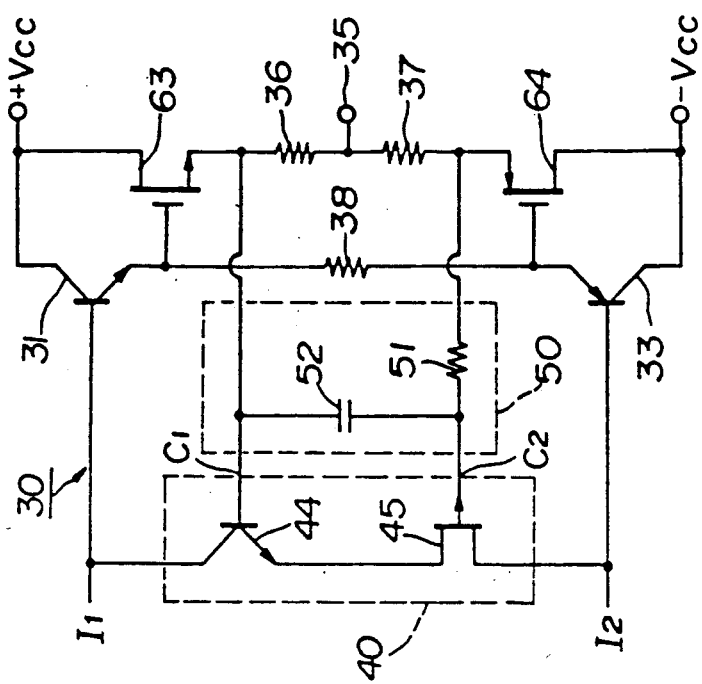
FIG. 5 is a circuit diagram of an amplifier portion of a second embodiment of the present invention.

The amplifier of the present invention comprising the CCB circuit may be applied to MOS type FET as shown in FIG. 5. Thus, a hybrid circuit or transistor composed of bipolar transistors and N-and P-channel MOSFETs 63 and 64 can be connected to this amplifier. Alternatively, other types of transistors such as junction-type FETs or SITs can be used. In FIG. 5, the same reference numerals are used to denote the elements corresponding to those appearing in FIG. 1. More specifically, this CCB circuit 40 is composed of an NPN transistor 44 having a collector connected to the base of NPN transistor 31, and a junction-type P-channel FET 45 having a source connected to the emitter of NPN transistor 44. The drain of P-channel FET 45 is connected to the base of PNP transistor 33, while the base of NPN transistor is connected to one end of first output resistor 36. The gate of P-channel FET 45 is connected to other end of first output resistor 37 through a resistor 51. A capacitor 52 is connected between the base of NPN transistor 44 and the gate of P-channel FET 45.

The N-channel MOSFET 63 has a drain connected to the positive power supply, a gate connected to the emitter of NPN transistor 31 and a source connected to one end of output resistor 36. On the other hand, the P-channel MOSFET 64 has a drain connected to the negative power supply, a gate connected to the emitter of PNP transistor 33 and a source connected to first output resistor 37. In order to produce a bias current having good frequency characteristics, a resistor 38 is connected between the emitters of NPN transistor 31 and PNP transistor 33.

The integration circuit 50 may employ a high-cut filter of second or higher order.

Figure 6:
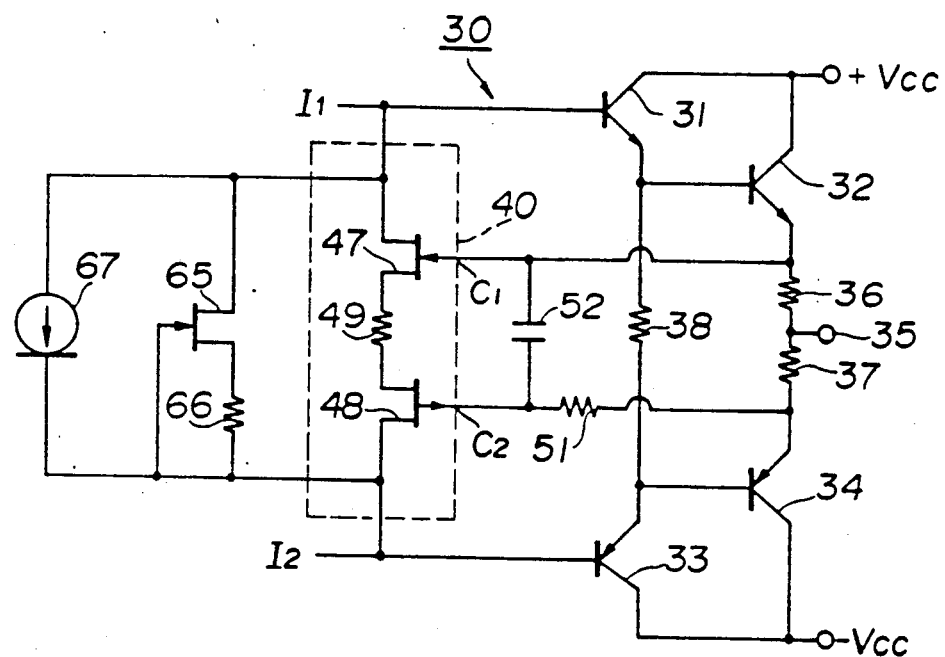
FIG. 6 is a circuit diagram of an amplifier portion of a third embodiment of the present invention.

FIG. 6 shows a portion of a third embodiment of the amplifier of the present invention having the CCB circuit.

This CCB circuit 40 includes a junction-type N-channel FET 47 and a junction type P-channel FET 48 having a source connected to the source of N-channel FET 47 via a resistor 49. An integrated value of the voltage appearing at both ends of the serial-connected output resistors 36 and 37 is applied between the gates of N- and P-channel FETs.

This constant-current circuit serves also temperature compensation means for NPN transistor 31 and PNP transistor 33. It is, therefore, possible to connect a constant-current element 67 or an N-channel FET 65 of constant-current connection, in parallel with the constant current circuit as shown in FIG. 6. A resistor 66 is intended for adjusting the drain current for the purpose of obtaining a predetermined constant current.

Figure 7:
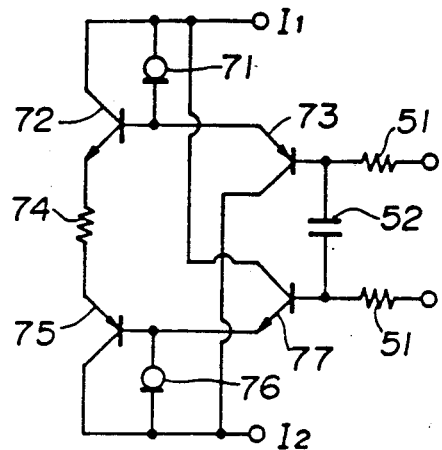
FIG. 7 is a circuit diagram of the third embodiment of the CCB circuit used in the present invention.

FIG. 7 shows a different example of the CCB circuit. This circuit includes a constant-current diode 71 having an anode connected to first relay terminal I₁ an NPN transistor 72 having a base and a collector connected to the cathode of constant-current diode 71 and first relay terminal I₁ respectively, a PNP transistor 73 having an emitter and a collector connected to the cathode of constant-current diode 71 and second relay terminal I₂ respectively, a resistor 74 having one end connected to the emitter of NPN transistor 72, a PNP transistor 75 having an emitter and a collector connected to other end of resistor 74 and second relay terminal I₂ respectively, a constant-current diode 76 having an anode and a cathode connected to the base of PNP transistor 75 and second relay terminal I₂ respectively, and an NPN transistor 77 having a collector and an emitter connected to first relay output terminal I₁ and the anode of constant-current diode 76 respectively. In the operation of this circuit, the current flowing through resistor 74 is controlled in accordance with the voltage which is applied between the bases of PNP transistor 73 and NPN transistor 77. The constant-current diodes in this circuit may be substituted by resistors.

Figure 8:
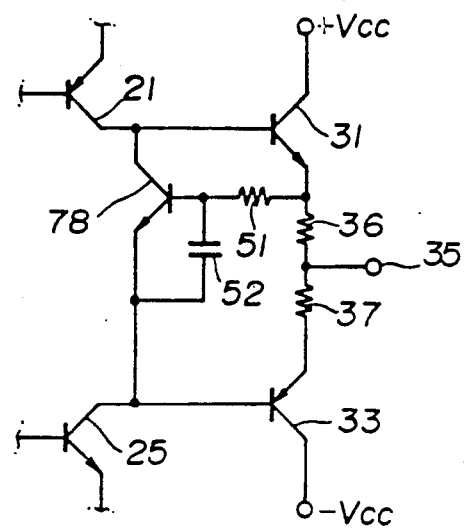
FIG. 8 is a circuit diagram of a fourth embodiment of the CCB circuit used in the present invention.

The CCB circuit used in the amplifiers of FIGS. 4 to 7 are suitable for two or three-stage Darlington-connected SEPP output stage. When the SEPP output stage is a single stage as shown in FIG. 8, since the voltage Vbb, between the bases of PNP transistor 33 and NPN transistor 31 is about 1.3 V, it is preferred that the emitter voltage of PNP transistor 33 to be driven is controlled from the base (control end) side.

In the SEPP output stage comprising an NPN transistor 31 having a collector connected to the positive power supply +Vcc and an emitter connected to one end of resistor 36, an output terminal 35 connected to other end of resistor 36 and also to one end of resistor 37, and a transistor 33 having an emitter connected to other end of resistor 37 and a collector connected to the negative power supply −Vcc, this CCB circuit includes an NPN transistor 78 having a collector connected to the base of NPN transistor 31 and an emitter connected to the base of PNP transistor 33. Thus, the integration circuit 50 includes a resistor 51 connected to the base of NPN transistor 78 and one end of resistor 36, and a capacitor 52 connected between the base and the emitter of NPN transistor 78.

In this feedback-type CCB circuit, with the power supply turned on, a rush idle current flows through the emitters of the power transistors during charge up by the capacitor 52 of the integration circuit. It is possible to set the level of this rush idle current within the ASO region of the power transistor, by making use of the CCB circuit 40 shown in FIG. 6. When a bias current flowing between FETs 47 and 48 is 2 mA, FETs 47, 48 having absolute values of Idss not less than 8 mA, may be used so as to adjust resistor 49 and thereby set the bias current to the level of 2 mA. The typical mutual conductance of FETs 47, 48 is preferably not less than 30 mS. When FETs 47 and 48 operate, the voltage Vss between the sources becomes about 20 times as high as the voltage Vgg between the gates, so that the width of fluctuation of the bias current may be decreased.

As an alternative, NPN transistor 78 may be replaced by a PNP transistor, in which case capacitor 52 would be relocated to be between the base and emitter of this replacement PNP transistor.

In an amplifier with a SEPP output stage having three or more stages of Darlington-connected power transistors, there is a risk that such power transistors may be broken by the rush idle current. Using a delay circuit in combination with a conventional CVB circuit so that the conventional CVB circuit operates for a certain period of 2 seconds after the turning on of the power supply obviates this risk.

Figure 9:
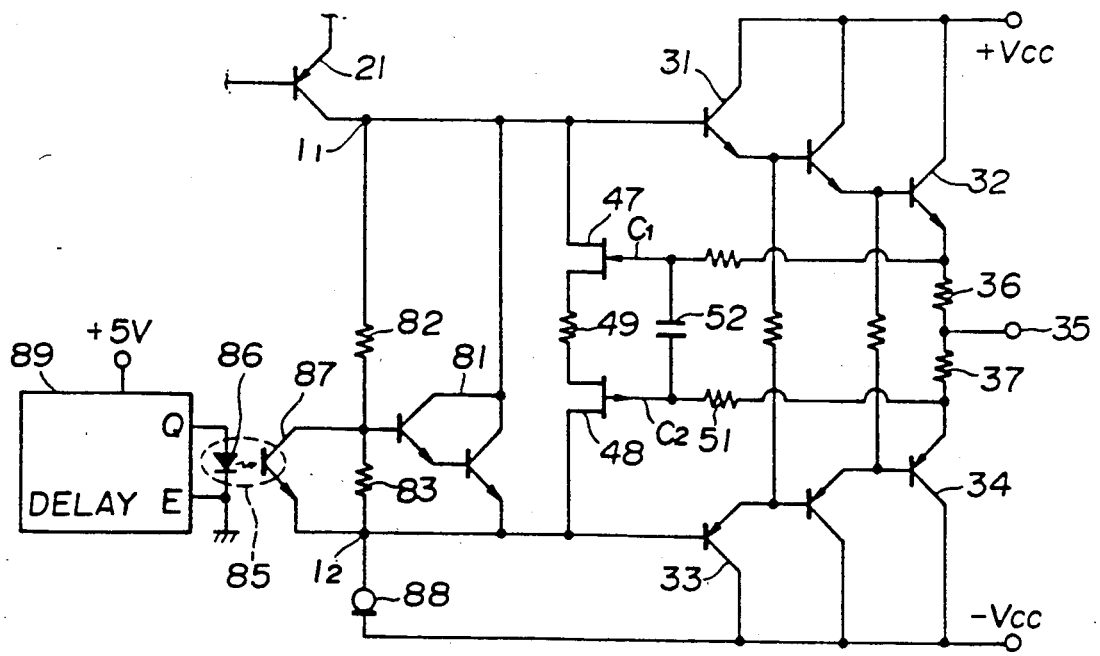
FIG. 9 is a circuit diagram illustrating a CCB circuit having a protecting circuit for preventing rush-idle current at which the power is supplied.

FIG. 9 is a portion of an amplifier including a CCB circuit of the present invention, an on-off controllable CVB circuit, a delay circuit for delaying a signal for a predetermined period after turning on of the power supply +5 volts, and an isolator designed to turn off the constant-voltage circuit only in response to the above signal. The CCB circuit is not described because it is similar to that of FIG. 6. The CVB circuit comprises a Darlington-connected NPN transistor 81 having a common collector connected to relay terminal I₁ and an emitter connected to relay terminal I₂, a resistor 82 having a high resistance value connected both to relay terminal I₁ and the base of NPN transistor 81, and a resistor 83 having a high resistance value and connected to the base of NPN transistor 81 and relay terminal I₂. The isolator 85 is, for example, a photo-coupler composed of a light-emitting diode 86 having an anode connected to the output terminal Q of the delay circuit 89 and a cathode connected to the ground, and a phototransistor 87 having a collector and a base connected to the base of NPN transistor 81 and the emitter of the same. The delay circuit 89 is triggered with the turning on of the power supply and has a CMOS-type monostable multivibrator which may be a model MC14528 available from Motorola Inc. A constant-current diode 88 or similar circuit is connected between the base and the collector of PNP transistor 33.

The described embodiments are sought to make the most of the advantages of the CCB circuit in accordance with the present invention. Preferably, the present invention may be applied to operational amplifiers such as TL-08X series available from Texas Instruments Inc., μA741 of Fairchild or 4558, in such a manner that the CCB circuit according to the invention is used in parallel with a reduced conventional CVB circuit whose capacity has been reduced from that obtained before the improvement. More specifically, the monolithic integrated circuit constituting the amplifier may be fabricated by forming, on a substrate of, for example, P-type, active elements such as transistors or resistors, and connecting the electrode portions of these elements through, for example, aluminum evapo-deposit lines. In this type of device, therefore, it is easy to obtain correlations of temperature coefficients between elements as compared with that of hybrid-type amplifiers. It is also possible to obtain a higher value of the ratio between the bias current borne by the CCB circuit according to the invention and the bias current borne by the CVB circuit, as compared with hybrid-type amplifiers. This improvement may easily be implanted on conventional monolithic operational amplifiers. More specifically, the region occupied by the conventional CVB circuit is partitioned for example at a ratio of 1:9, and the conventional CVB circuit is scaled down within the region corresponding to "1", while the CCB circuit such as a constant-current diode or a constant-current-connected FET is formed in the region corresponding to "9". Although this CCB circuit has a performance 0.9 times less than that of the conventional CVB circuit, the layout of the circuit can be appreciably facilitated because it is possible to make use of the vacant region on the substrate around the bias circuit and because only two connecting lines are required.

Figure 10:
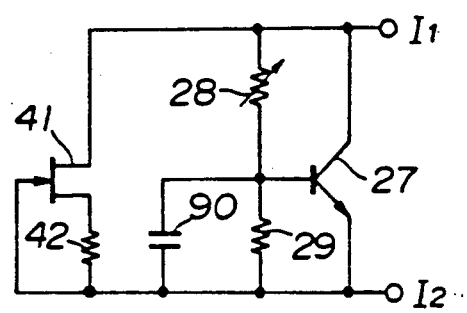
FIG. 10 is a circuit diagram of a CCB circuit designed for a large current.

FIG. 10 shows an embodiment teaching such an application. This embodiment has a bias circuit composed of a parallel connection of a CCB circuit and a CVB circuit.

The CCB circuit comprises a FET 41 having a drain connected to relay terminal I₁ and a gate connected to relay terminal I₂, and a resistor 42 connected between the source of FET 41 and relay terminal I₂.

On the other hand, the CVB circuit includes an NPN transistor 27 having a collector and a base connected to relay terminals I₁ and I₂ respectively, a variable resistor 28 connected between relay terminal I₁ and the base of NPN transistor 27, and a resistor 29 connected between the base of NPN transistor 27 and relay terminal I₂. The capacitor 90 is intended for imparting constant-current characteristic to the CVB circuit. The capacitor 90 has, for example, a capacitance of 100 micro-farads, and is connected between the base of NPN transistor 27 and relay terminal I₂. The capacitor 27 is provided for imparting constant-current characteristic to the conventional CVB circuit.

A description will be made hereinafter as to the method of determining the shares or proportions of the current to be borne by the CCB circuit and the CVB circuit.

An operation temperature range to the amplifier is for example between 0° and 70° C. according to the commercial regulations. Within this operation temperature range, the basic value A and fluctuation width B or (A±B) of the bias current flowing between relay points I₁ and I₂ is calculated or predicted. Subsequently, the basic value C and fluctuation width D or (C±D) of the current flowing through the CCB circuit is obtained to set the current value of the CCB circuit at appropriate operative temperature so that the electric current is determined to meet with the condition of (C+D)≦A. The remaining bias current is absorbed by or passed through a CVB circuit whose internal resistance has been increased about (A−B)/B times. The values A, B, C and D are all positive.

In an improved amplifier as an embodiment of the present invention, which is obtained by improving the conventional amplifier, the conventional bias current is initially measured. The FET 41 and resistor 42 are selected so that 99 to 80% of the measured current flow through the CCB circuit, while the remaining current is supplied to a CVB circuit by setting the values of the variable resistors 28 and 29 between $1/(1-0.99)$ and $1/(1-0.8)$ times higher than that of the conventional corresponding resistors.

Figure 11:
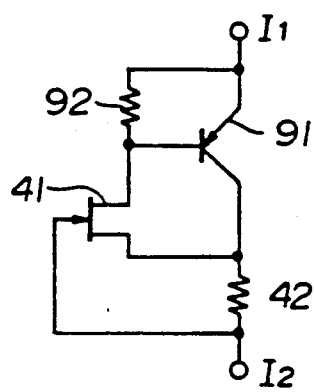
FIG. 11 is a circuit diagram of a CCB circuit connected in parallel to a conventional CVB circuit which has a reduced constant-voltage effect.

FIG. 11 shows a circuit suitable for use in which the current supplied to the CCB circuit exceeds for example 10 mA since the Idss of FET 41 is usually not greater than 10 mA.

This circuit comprises a PNP transistor 91 having a emitter connected to relay terminal $I_1$, a FET 41 having a drain connected to the base of PNP transistor 91 and a gate connected to relay terminal $I_2$, a resistor 92 connected to relay terminal $I_1$ and the base of PNP transistor 91, and a resistor 42 connected to the junction point between the collector of PNP transistor 91 and the source of FET 41 and to relay terminal $I_2$.

Figure 12:
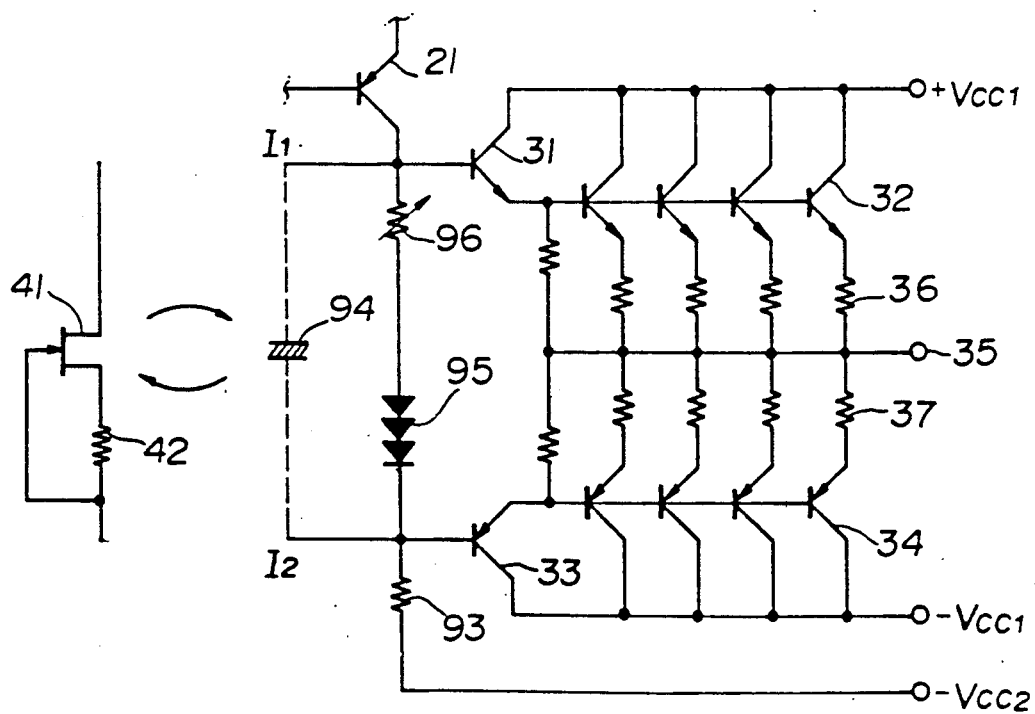
FIG. 12 is a circuit diagram of a class AB amplifier composed of a CCB circuit constructed in accordance with the invention and connected in parallel to a diode-type bias circuit of a class A amplifier.

FIG. 12 is a partial circuit diagram constituting a class-AB amplifier which is obtained be connecting a CCB circuit according to the present invention in parallel with a conventional bias circuit of a class A amplifier (Model No. M-4, commercially available from Pioneer Corporation, Japan) which is said to be one capable of providing the highest quality of sound amongst all existing amplifiers.

This circuit has four parallel NPN transistor 32 and four parallel PNP transistors 34, as well as a variable resistor 96 connected at its one end to relay terminal $I_1$ and a constant-voltage element 95 having an anode connected to other end of the variable resistor 96.

The constant-voltage element 95 has three temperature-compensation diodes connected in series and sealed in a resin container having a high heat conductivity, and is connected at its cathode to relay terminal $I_2$.

The constant-voltage element 95 thus constructed is attached to heat-radiating fins (or cooler) to which are attached the four sets of transistors 32 and 34 mentioned above. For a class A amplifier, an electrolytic capacitor 94 is connected between relay terminals $I_1$ and $I_2$ for purpose of attaining a higher degree of constant of the voltage between relay terminals $I_1$ and $I_2$. An improvement according to the present invention is to merely eliminate the capacitor 94 so that the CCB circuit restrains only the current level. Before the improvement, the heat-radiation fins exhibited such a high temperature as could never be touched by human hand even 2 to 10 minutes after the operation. However, in the improved amplifier, the heat-radiation fins are maintained at such a temperature as can be touched by human hand during the operation. This suggests that the class of the amplifier has changed from class A to class AB.

A test was conducted by four listeners including the present inventor, for purpose of comparison between the quality of sound produced by the amplifier before improvement and that of the sound produced by the improved amplifier. Although there was an interval of about 3 hours for the improvement, all the four listeners judged that the sound quality has been refined as the result of improvement of the amplifier. Through the test, the same system and source were used without any change, except for the modification specifically mentioned above.

As will be understood from the foregoing description, according to the present invention, the bipolar transistors of the positive and negative source sides of the output stage are never turned off, so that dynamic distortion of the output signal may be reduced. In addition, the class AB power amplifier incorporating the constant-current circuit according to the present invention does not cause the power NPN and PNP transistors to be turned off, even when it is applied to an inductive load such as speaker etc, whereby the sound may be reproduced with high degree of reality even though it is delicate. Thus, the amplifier of the present invention may be used in private or business acoustic instruments or PAs. In particular, the amplifier of the present invention is suitable for use as an integrated circuit type operational amplifier of music instruments other than the above-mentioned instruments.

The circuit with respect to FIG. 8 may be applied to a compact disc (CD) player or laser video (LV) player as tracking and focus servo amplifiers with good tractability and clear focussing characteristics. In the case of application to a DENON CDC-1610 type CD player commercially available from Nippon Columbia K.K., Japan, or YAMAHA CD-1a or CDX-2200 type CD player commercially available from YAMAHA Corporation, a seek time to a read-in or programmed area or an index search to a predetermined track number on any improved player is faster than that of the corresponding original player. Also, sound qualities of the improved player are better than that of the corresponding original player when the same music source compact disc was used It seems the error rate for reading the arrangements of pit lengths along the track on the disc is reduced. In the case of application to a YAMAHA LV-X1 type LV player, the picture or text of the CRT display is clearer. This circuit can also be applied to a CD-ROM disc player, magneto-optic recording system and magnetic disc system for mass storage in the same manner. This circuit was improved by using a battery or a diode for inversely charging capacitor 52.

As described, the constant current bias circuit or element of the present invention is disposed at a master position, i.e., the primary bases of Darlington transistors (TRs) in a SEPP stage, rather than at a slave position, i.e. at secondary or third bases of Darlington transistors (TRs) of the SEPP stage.

Conventional constant current bias circuits or elements are arranged at the slave position in contrast to the master position as in the present invention. Further, conventional constant voltage bias circuits or elements must be used in conventional amplifier circuits at the master position in order to yield an operable amplifier.

It was unexpectedly found by the present inventor that the differential values of internal resistance of the bias circuit relates to the quality of the amplifier. An amplifier having the constant-current bias circuit of the present invention has better sound qualities than does amplifiers which employ a constant voltage bias circuit instead.

The invention with respect to FIG. 9 has five additional embodiments shown respectively in FIGS. 13-16 and 18. In the first embodiment, a "break contact" having a low resistor serially connected thereto is paralleled with the resistor 51, for quickly charging capacitor 52. In the second embodiment, "make contacts" each having a low resistor serially connected thereto are paralleled with the resistors 36, 37 respectively, for limiting rush emitter currents through transistors or TRs 32, 34. In the third embodiment, a "make contact" is provided between a positive power supply +Vcc and any collectors of NPN Darlington TRs 31, 32 of the SEPP output stage, for reducing a total emitter current. Another "make contact" is also coupled between a negative power supply −Vcc and a collector of the corresponding PNP Darlington TRs 33, 34 of SEPP output stage. In the embodiment without the timer controlled contacts, a battery serially connected to the capacitor 52 is used for adversely charging the capacitor 52. Alternatively, two capacitors each connecting between a gate and a source of FETs 47 or 48 are provided. The "make contacts" and "break contacts" are controlled by a delay circuit and are used instead of conventional constant voltage bias circuit.

Figure 13:
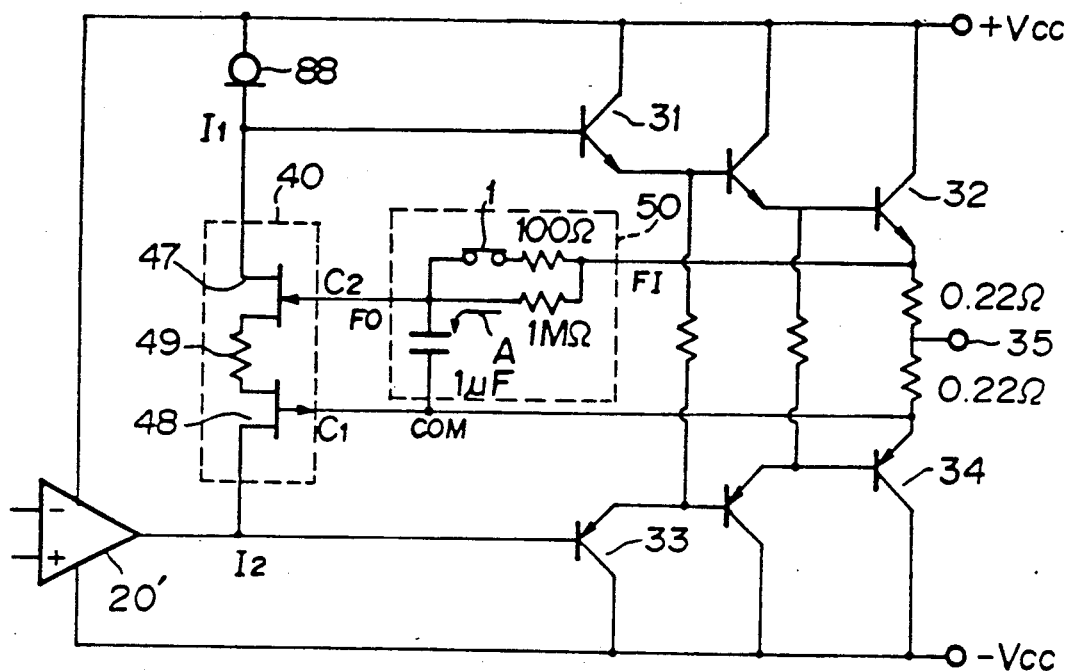
FIG. 13 is a circuit diagram of a first variation of FIG. 9.
Figure 14:
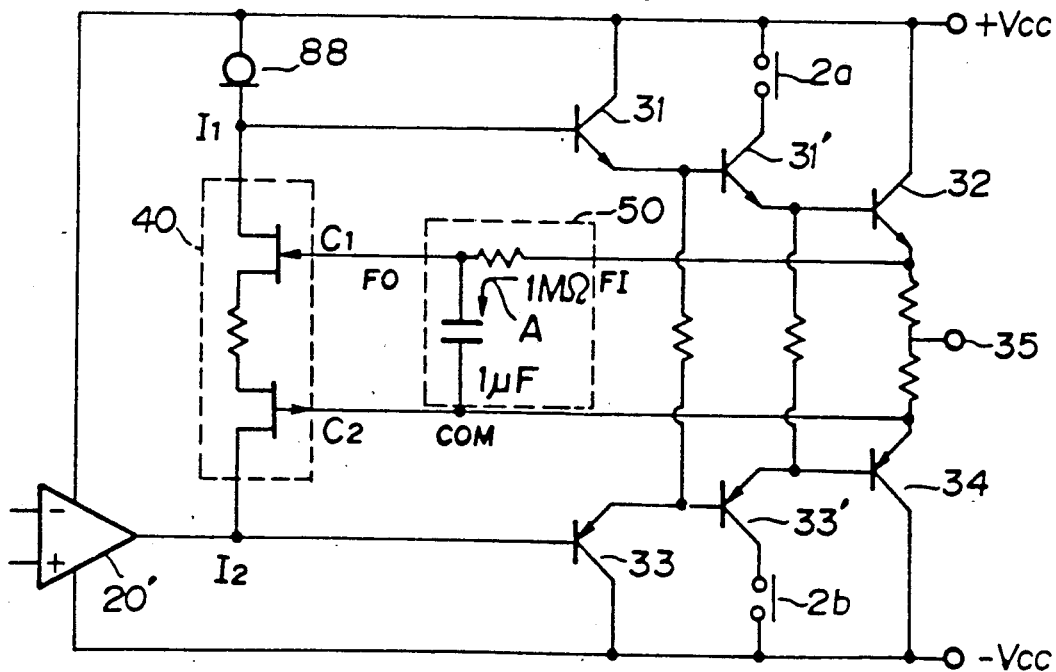
FIG. 14 is a circuit diagram of a second variation of FIG. 9.
Figure 15:
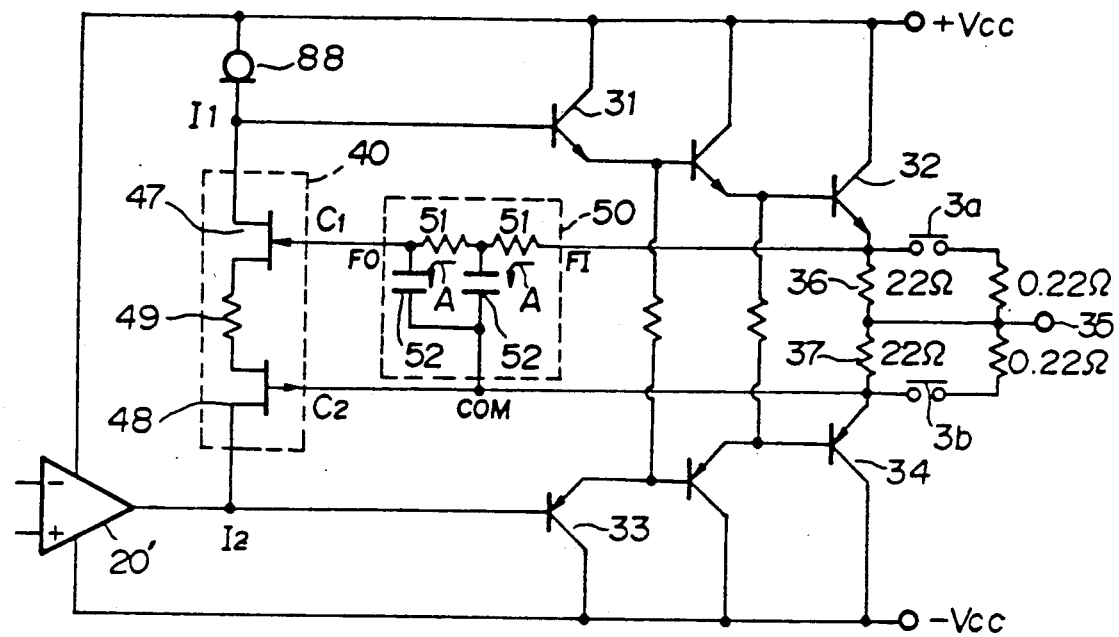
FIG. 15 is a circuit diagram of a third variation of FIG. 9.

The "break contact 1" as shown in FIG. 13 or "make contacts 2a and 2b, or 3a and 3b" as shown in FIG. 14 or 15 are used instead of the conventional constant voltage bias circuit. These contacts are electromagnetic relay contacts or photocoupled MOSFET switches controlled by the delay circuit 89 such as a monostable multivibrator. Therefore, at first, the power turns on to provide positive and negative voltages ±Vcc and also to provide +5 volt to multivibrator 89. After the predetermined period, for example, 3 seconds, output Q of the multivibrator 89 turns logical "high" to energize the electromagnetic relay to act on the above contacts. The operational amplifier 20′ such as 4558 or other discrete circuits is provided to drive the SEPP output stage.

In FIG. 13, the "break contact 1" having a low resistor such as 100 ohm serially connected thereto is paralleled with the resistor 51 such as 1 megohm, for quickly charging a capacitor 52 such as 1 micro-farad when power supplies ±Vcc are turned on. The coil of the electromagnetic relay is coupled to the delay circuit 89 as shown in FIG. 9. Therefore, upon turning on the power supplies ±Vcc and +5 volt, the 1 microfarad capacitor 52 is quickly charged via the 100 ohm resistor and constant-current bias circuit 40 becomes stable before the initial currents through the 0.22 ohm resistors increase to a dangerous level. For a predetermined period, for example, 3 seconds, the output Q of the delay circuit 89 goes high to energize the coil and thereby make the "break contact 1" to be opened to provide the ordinal high cut filter 50 comprising the 1 megohm resistor 51 and the 1 micro-farad capacitor 52. Alternatively, the "break contact 1" having the low resistor may be substituted with a depletion-type photo-MOSFET such as AQV414 available from Matsushita Electric Tool Corporation. In this case, the construction of the AQV414 is similar to that of the photo-coupler 85 except that the MOSFET thereof is in an ON state or typically 50 ohm when the light-emitting diode of the AQV414 does not emit the light, and the MOSFET is in an OFF state or infinite resistance when the light-emitting diode of the AQV414 emits the light.

In FIG. 14, the "make contact" 2a is provided between a positive power supply +Vcc and any collectors of NPN Darlington TRs 31, 31′, 32 of the SEPP output stage, for reducing total emitter currents. It is only shown in case of the middle stage of the TR 31′. Another "make contact" 2b is also coupled between a negative power supply −Vcc and a collector of the corresponding PNP Darlington TRs 33, 33′, 34 (only shown in case of TR 33′) of the SEPP output stage. These TRs 31′ and 33′ have diode functions between respective base and emitter if a power would not supply to its collector. However, when the power supplies to the collector and when the current gains of the TRs 31′ and 33′ are assumed to be 100 respectively, 1 mA base current thereof would induce 100 mA collector current.

In the SEPP output stage as shown in FIG. 14, maximum rush current is limited to 1/100 level than that of when the collectors of TRs 31′ and 33′ are connected to the terminals ±Vcc, respectively.

In FIG. 15, "make contacts" 3a and 3b each having a 0.22 ohm resistor serially connected thereto are paralleled with the 22 ohm resistors 36, 37 respectively, for limiting rush emitter currents through TRs 32, 34 to about 1/100 level. Instead of a first order high cut filter, the second order high cut filter 50 may be used which comprises serial resistors 51 connected between a filter input FI and a filter output FO, and the capacitors 52 each connected between the filter output FO and common COM, or junctions of the serial resistors and the common COM.

The above three embodiments avoid the disadvantages with respect to charging the capacitor or capacitors 52 along the arrow A as shown in FIGS. 13 to 15 which causes gate-gate voltage between $C_1$ and $C_2$ to be maintained initially at about zero volts and then increased to the appropriate voltage level such as 44 mV.

Figure 16:
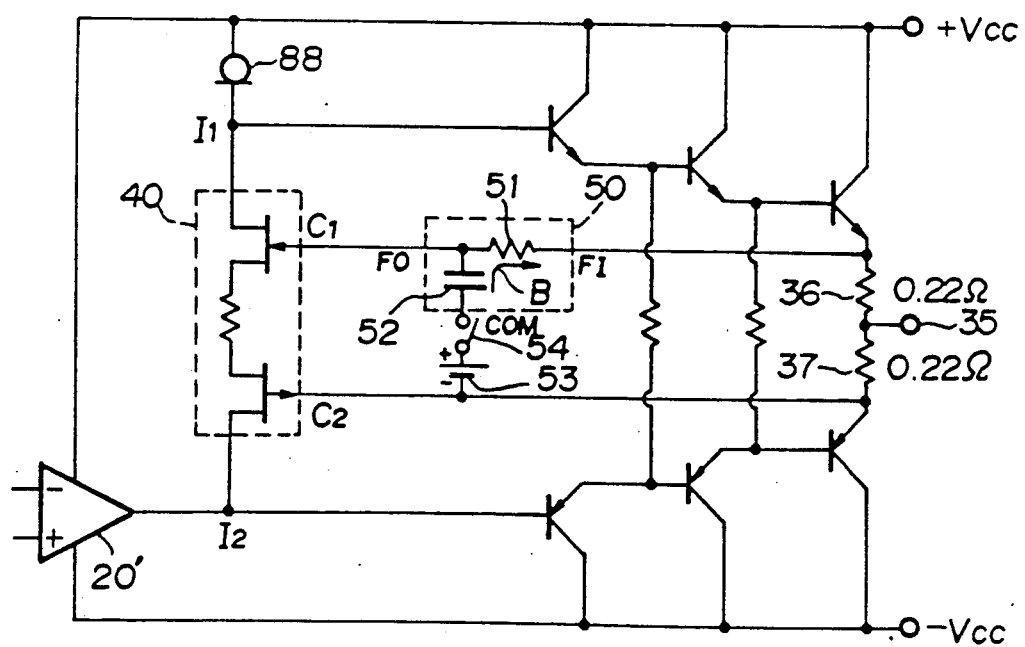
FIG. 16 is a circuit diagram of a fourth variation of FIG. 9.

In FIG. 16, a battery or cell 53 and a switch 54 connected to the capacitor 52 is used for adversely charging the capacitor 52. Therefore, the high cut filter 50 comprises a resistor 51 connected between a filter input FI and a filter output FO, and the capacitor 52 connected between the filter output FO and a common COM. When the power supplies ±Vcc and the energy of the dry cell 53 are synchronously turned on, the gate-gate voltage between $C_1$ and $C_2$ starts at a predetermined level such as 1.5 volt and then decrease to 44 mV. Therefore, no rush current is generated because the capacitor adversely charges along the arrow B to provide an appropriate level between the $C_1$ and $C_2$.

Alternatively, the means for adversely charging the capacitor 52 comprises a constant-voltage (CV) element or diode 55 connected between the base of transistor 31 and the common COM of the high cut filter 50, and a constant-current (CC) element or diode 56 connected between the common COM and the base of transistor 33 or negative power supply −Vcc.

Figure 17:
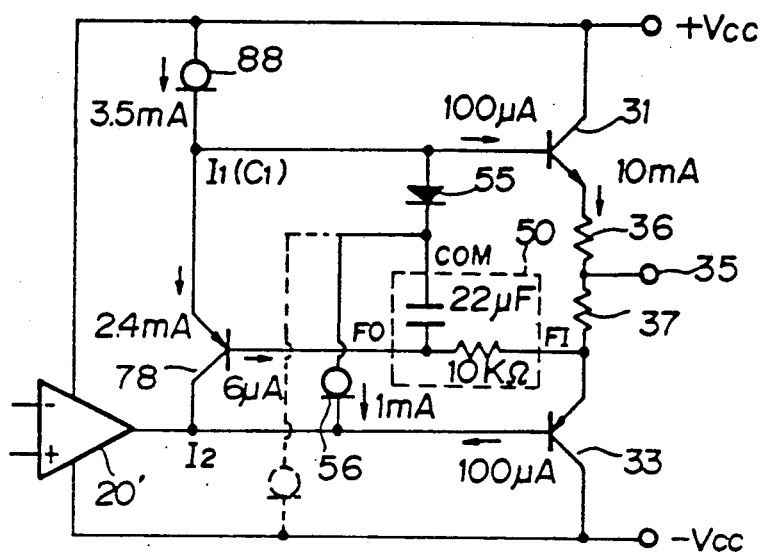
FIG. 17 is a circuit diagram of a power amplifier in accordance with the invention for a CD player.

In the preferred embodiment of FIG. 17, the complementary NPN and PNP TRs 31 and 33 are identical to those of the conventional complementary emitter followers as shown in FIG. 8-3 in pages 120 and 121 of the Compact Disc Player: Maintenance and Repair, Gordon McComb and John Cook eds., and identified as 2SD667 and 2SB647, respectively, each commercially available from Hitachi Corporation in Japan. With the Denon DCD1610 CD player, 2SD1985 and 2SB941A available from Matsushita Corporation in Japan are used. The value of the two emitter or output resistors have 2.2 ohm for the focus servo amplifier or 4.7 ohm for the fine tracking servo amplifier.

Figure 17A:
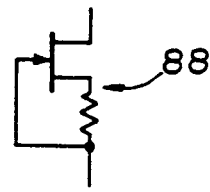
FIGS. 17A, B, C show circuit diagrams of alternatives for the constant current element of FIG. 17.
Figure 17B:
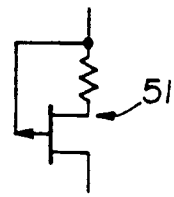

The second PNP TR 78 is suitable to use a super beta TR, that is, a high hFE TR (DC Current Gain ≧ 1000 at Ic=1.0 mA). In fact, 2SA970 PNP TR (hFE=about 400 at Ic=1.0 mA, $V_{be}$=−0.6 V) is used for Denon DCD-1610. The CV diode 55 can be a general purpose diode such as 1S1555 (Toshiba Corp.) the Forward Voltage $V_f$ of which is about 0.65 volt at $I_f$=1.0 mA. For example, the constant-current element or diode 88 provides about 3.5 mA while the constant-current element or diode 56 forwards about 1.0 mA. The N-channel FET 2SK162 ($I_{DSS}$=about 20 mA at $V_{DS}$=10 volt) and 100 ohm resistor connected between the gate and the source of the 2SK162 can be used as the constant-current element 88 with the drain thereof as the anode of the element and the gate thereof as the cathode as shown in FIG. 17A. Also, the CC element 88 can be substituted with P-channel FET and the corresponding resistor as shown in FIG. 17B.

Figure 18:
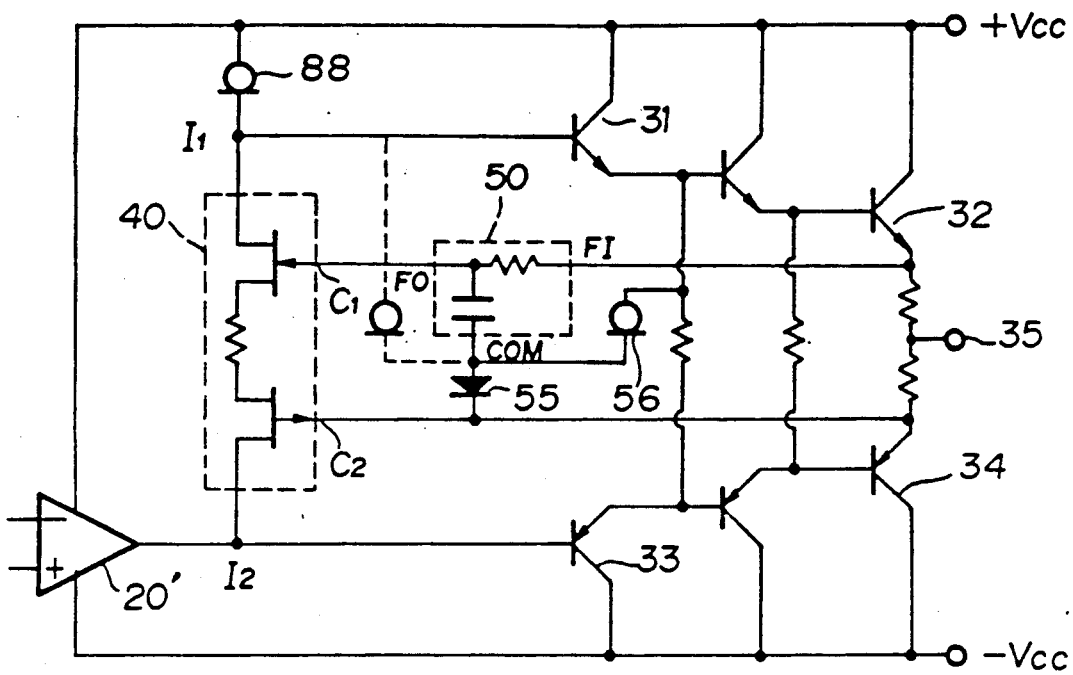
FIG. 18 is a circuit diagram of a fifth variation of FIG. 9.

The constant-current element or diode 56 must have good constant-current characteristics at the low voltage region such as ≦0.65 to 3.0 volt because the voltage between $I_1$ and $I_2$ is variable above 1.3 volt for the circuit as shown in FIG. 17, or above 3.9 volt for the circuit as shown in FIG. 18 when an input signal is applied to the amplifier. Even if the voltage between $I_1$ and $I_2$ is variable upon applying the input signal, the current value of the CC element 56 is substantially constant (about 1 mA) and therefore the Forward Voltage between the CV diode 55 is constant. The commercially available constant-current diode do not fulfill the above requirement, while the FET such as 2SK117, 2SK162, 2SK170, 2SK147, 2SJ72 or 2SJ74 fulfills the requirement and may be used. The remainder, about 2.5 mA, forwarded as the emitter current of the 2SA970, is controlled with the base current via a 10 kilo-ohm integrating resistor and a 22 micro-farad capacitor.

In the circuit of FIG. 17, it is assumed that each hFE of NPN and PNP transistors 31 and 33 is 99 at Vbe=616 mV and ↑$I_e$↑ =10 mA, the hFE of PNP transistor 78 is 400 at Veb=600 mV, each resistor 36 and 37 is 2.2 ohm, resistor 51 is 10 kiloohm, current values of the CC elements 88 and 56 are 3.5 mA and 1 mA, respectively, and the Forward Voltage of the CV diode 55 is 650 mV at Vf=1 mA. If each 100 microampere is supplied to each base of transistors 31 and 33 to provide 10 mA of the idle current through resistors 36 and 37, the voltage between cascaded resistors 36 and 37 is 44 mV and the voltage between the base of transistor 31 and the emitter of transistor 33 therefore is 660 mV. The remaining 2.4 mA must be supplied to transistor 78 as an emitter current and therefore the 6 microampere of the base current is supplied to the emitter of transistor 33 via the 10 kilo-ohm resistor 51 and therefore 60 mV of the voltage is generated between resistor 51.

Therefore, the idle emitter current of transistors 31 and 33 is about 10 mA, because the sum of ↑Vbe↑ of transistor 78 and the voltage between resistor 51 is equal to 660 mV, and 6 micro-ampere is negligible compared with the 10 mA idle current at the emitter of transistor 33. The operational amplifier 20' will provide the 3.5 mA sink current from $I_2$ under the idle condition. When the input signal is applied to the amplifier 20', voltages between +Vcc and $I_1$, and between $I_1$ and $I_2$ are variable but the current values of the constant-current elements 88 or 56 is substantially constant (about 3.5 mA or 1 mA) and therefore the Forward Voltage of the CV diode 55 or voltage between $C_1$ and COM is constant. The capacitor 52 and resistor 51 therefore have a high cut filtering function to average the base current of transistor 78.

Figure 17C:
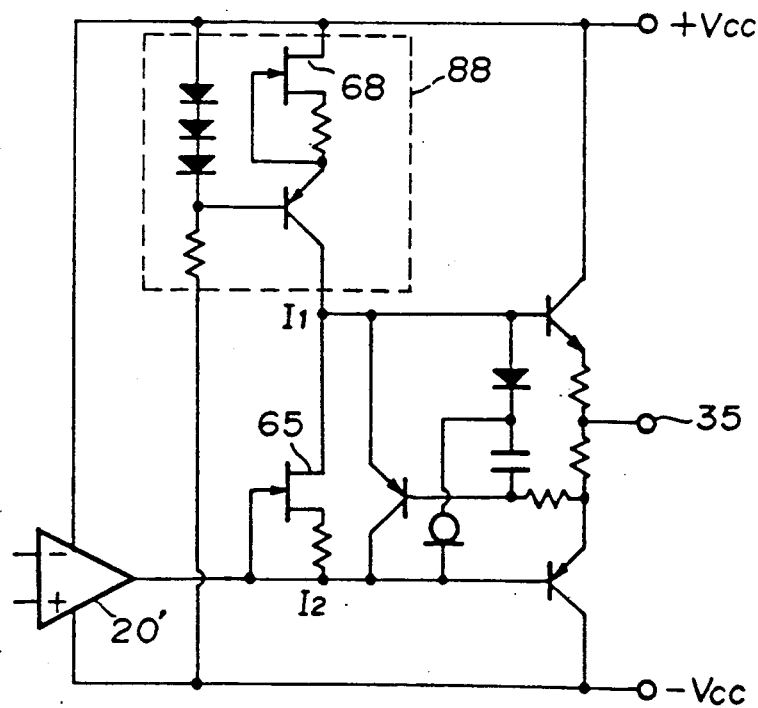

In the circuit of FIG. 17C, in order to reduce the controlled emitter current and thereby increase the resistance of the integrating resistor 51 or reduce the capacitance of the capacitor 52, an auxiliary constant-current circuit comprising FET 65 can be operatively connected between the relay terminals $I_1$ and $I_2$. Further, thermo-coupled dual FETs such as 2SK146 can be used as FETs 65 and 68, respectively, to reduce the difference between the differential values of its current dI/dT of the FETs 65 and 68 over the operational temperature range such as 0° to 70° C. Therefore, the drain-gate voltage Vdg applied to FET 68 is preset to be almost the same as that of FET 65 under the idle condition.

In the circuits of FIGS. 13 to 17, 17C and 18, when an operational (OP) amplifier comprising a SEPP output stage having NPN and PNP transistors, such as 4558 or uA741, is used as the amplifier 20', the sink current of the OP amplifier is only supplied to the relay terminal $I_2$ during an operation. This eliminates the switching of the NPN and PNP transistors providing the sink and source currents of the OP amplifier, respectively. Therefore, the superior continuous response will be obtained with the PNP transistor of the output stage while the NPN transistor thereof is in the OFF condition even if an input signal is applied.

It is unexpectedly found that when the OP amplifier operates between, for example, 1 mA of sink and source (peak to peak) currents from the output terminal, parallelling a 1.5 mA constant current diode comprising a junction-type FET between the output terminal and positive or negative power supply prevents the output current from switching from sink to source current or vice versa. This principle is applied later in connection with the discussion of FIG. 22.

In an effort to reduce the number of electronic components required for compact disc players, large scale integration (LSI) chips are employed and which are complete circuits. LSI chips serve as preamplifiers, EFM demodulators, tracking and focus servos, system microprocessors and digital/analog converters. For a given compact disc player, these functions may be done by only one or two LSI chips or spread over a half dozen or so LSI chips.

Briefly stated, the circuitry for a typical compact disc player includes a preamplifier for amplifying or boosting signals from photodetectors, EFM demodulators which decodes the boosted high frequency EFM signal generated by the photodiodes, tracking and focus servos which generate control voltages for operating tracking and focus coils in response to receipt of the boosted signals, a system microprocessor assuring that all components operate in tandem, and a digital/analog converter which takes 16 bits of digital data output from the EFM demodulator, samples the data, and provides and analog signal based on the value of the binary digits decoded from the disc.

A compact disc player also typically includes various clock circuits for precise timing, a random access memory for temporarily storing EFM data, and a disc spindle servo and associated oscillator circuits for keeping the disc spinning at the proper speed.

There is also a pickup mounted on a transport mechanism which moves it radially from the inside of the disc to the outside. In order to maintain proper focus and tracking correction necessitated because of disc warpage the tracking and focus coils are used for precisely following an information track on a disc. When current is applied to the focus coils, an objective lens moves up and down. When current is applied to the tracking coils, the objective lens moves back and forth or a mirror shifts side to side to direct a reflected beam to precisely follow the information track on the disc.

Figure 20:
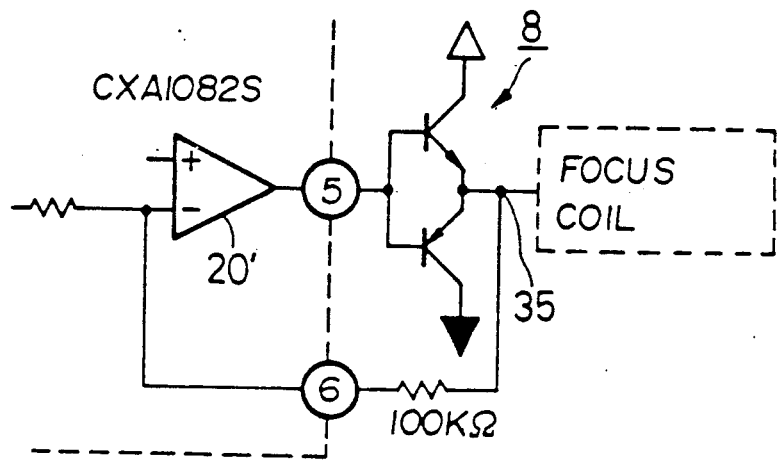
FIG. 20 is a block diagram of a focusing servo of the prior art.
Figure 21:
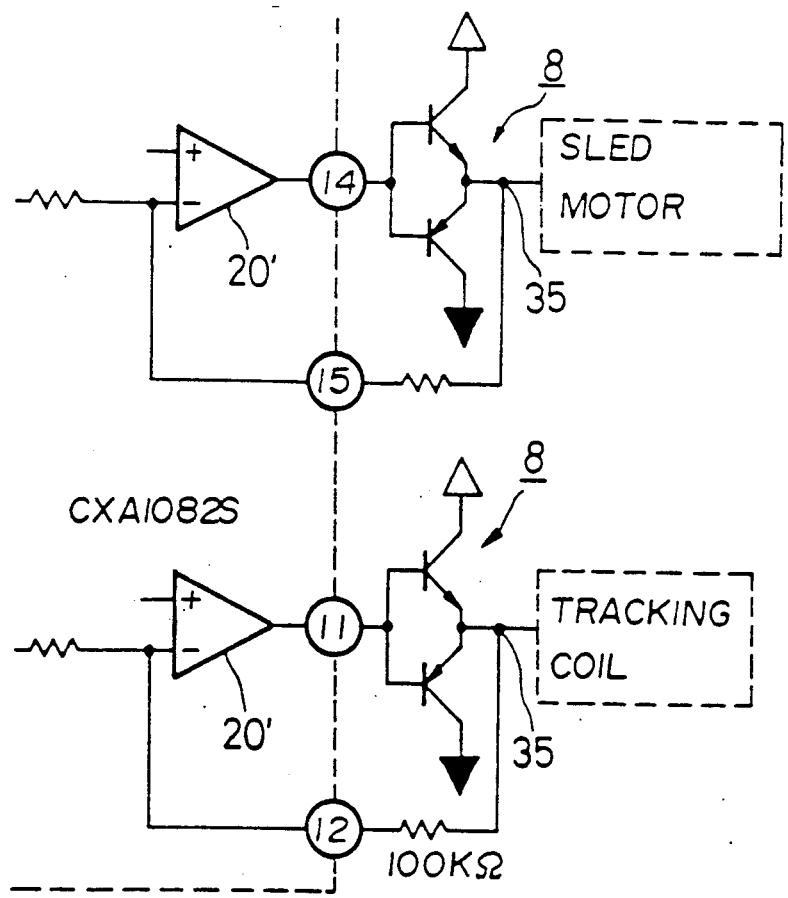
FIG. 21 is a block diagram of a tracking servo and sled servo of the prior art.

Heretofore, a common base of complementary emitter followers is connected to the output (#5 or #11) of a large scale integration (LSI) chip CXA1082A by Sony Corporation while a common emitter of the complementary emitter followers is connected both to the focus or tracking coil and to the input (#6 or #12)

thereof via a 100 kilo-ohm resistor as shown in FIGS. 20 or 21.

With respect to connection between a large scale integration (LSI) chip CXA1082S by Sony Corporation and the circuit of FIG. 17, the relay terminal $I_2$ is connected to the FEO terminal (#5) of the CXA1082S for the focus servo as shown in FIG. 20, or to the TA$\theta$ terminal (#11) for the fine tracking servo as shown in FIG. 21. The output 35 connected to the focus coil is connected to the FE$\theta$ terminal (#6) via a 100 kilo-ohm resistor as shown in FIG. 20 while the output 35 connected to the tracking coil is connected to the TA$\theta$ terminal (#12) via a 100 kilo-ohm resistor as shown in FIG. 21. Instead of the constant current element 56, the dot lined constant-current element can be provided with the corresponding current thereto.

With respect to FIG. 18, this circuit is suitable for use in driving a loudspeaker having very low impedance such as 2 to 8 ohm over the full audio frequency range.

The CC diode 56 is connected between the emitter of NPN transistor 31 and the common COM of the filter 50 while the CV diode 55 is connected between the common COM and the relay terminal $C_2$. Instead of the CC diode 56, the dot lined constant-current element as connected in FIG. 18 or the constant-circuit element (not shown) connected between point A and +Vcc line is suitable. However, the cascaded N— and P—channel FETs with or without an intermediate resistor can be substituted with the above second PNP TR.

Figure 19:
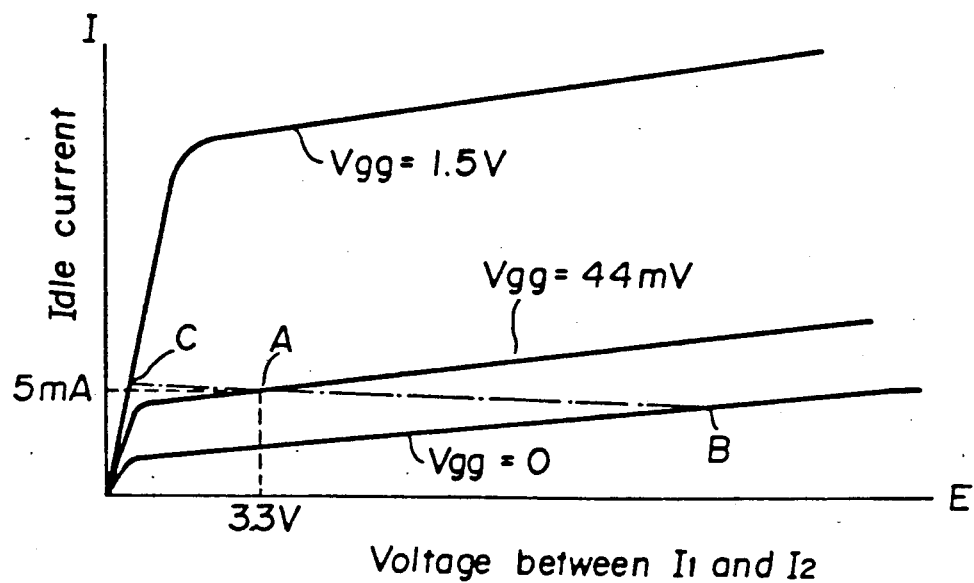
FIG. 19 is a graph showing the current vs. voltage characteristics of a voltage-controlled constant-current bias circuit.

FIG. 19 shows current vs voltage characteristics of the voltage-controlled constant-current bias circuit 40 with or without the means for adversely charging the capacitor 52. Point A shows an ordinal bias point, that is, its idle current being 5 mA and the voltage between $I_1$ and $I_2$ being 3.3 volts under Vgg=44 mV. Point B shows the initial bias condition which is generated by the circuits as shown in FIGS. 13 to 16 even if the improvements are applied. Point C shows an initial bias condition of the circuit as shown in FIG. 16. When the bias point is transferred from the point B to the point A, the unfavorable rush current states is indispensable. On the contrary, the bias point is transferred from the point C to the point A, the no rush current state is produced.

The predetermined voltage must be higher than, for example, Vgg=44 to 94 mV, and can be obtained by anode-cathode voltage V$_f$ of a diode 55 to be current supported by constant-current element 56 or the like and the resistor as shown in FIGS. 17 and 18, respectively. Many diodes such as germanium diodes, schottkey diodes and general purpose diodes may be used and V$_f$ is ranged between about 0.2 and 0.7 volts.

A power amplifier comprising two capacitors, each connecting a gate and a source of FETs 47 or 48, is unsuccessful and the narrowest portion of copper on a printed circuit board is cut like a fuse when the power is turned on.

The circuit of FIG. 17 may be used on a DENON CDC-1610 type CD player. The circuit of FIG. 18 may be used on power amplifier TA-F555 ESX of Sony Corporation.

A CD player uses the 1-beam or 3-beam optical pickup system to read the data on the disc with an accurate focus and traceability. This optical pickup system essentially comprises an optical pickup mounted on a transport mechanism and an electric servo circuit. With the 3-beam system, the optical pickup comprises a laser diode for emitting a constant (or coherent) light to the disc, a diffraction grating, a dichroic prism, a collimator, a quarter wave plate, an objective lens, a focusing coil for vertically driving the objective lens, a tracking coil for radially fine driving the objective lens, a cylindrical lens and six photodetectors A to F for detecting a RF data signal, a radial tracking error signal and a focusing error signal as shown in FIGS. 2-7 and 2-8 and in pages 26 to 34 of a book entitled "Compact Disc Player: Maintenance and Repair"—Gordon McComb and John Cook (ISBN 0-8306-2790-1), Tab Books Inc., Blue Ridge Summit, Pa., pages 22-42.

The electric servo circuit comprises RF amplifiers each having an input connected to the photodetectors A and C or B and D and providing VA and VB signals respectively, a focusing error amplifier for subtracting the VA signal by the VB signal and providing a focusing error signal for driving a focus coil which generates a vertical reciprocating movement of the objective lens to focus on a track in the rotating disc, tracking preamplifiers each having an input connected to the photodetectors E or F and providing VE and VF signals respectively, a tracking error amplifier for subtracting the VE signal by the VF signal and providing a tracking error signal for driving a tracking coil which generates radial fine movement of the objective lens to follow along the track of the rotating disc. Also, radial course movement is generated by the transport mechanism.

The conventional servo circuit includes tracking and focusing error amplifiers in the 3-beam optical pickup system use LSIs such as Sony Corporation's CX20109 and CX20108 (or improvement LSIs CXA1081M and CXA1082S) and complementary emitter followers 8 as shown in FIGS. 20 to 21. FIGS. 20 to 21 are based on circuit diagrams taken from Sony semiconductor 1C, Data Book of 1989; Compact Disc, pages 23 to 76 and 101 to 166. The VA-VF signals may be considered to be voltage signals in the CX20109 or CXA1081M.

The purpose and operation of the complementary emitter followers 8 is to provide a lower output impedance with gain=1. The output terminal FEG and TA8 of the CXA10825 (LSI) can provide about 10 mA of sink or source current which cannot drive the focus or the fine tracking servo coil. By using the complementary emitter followers, about 300 mA of sink or source current, enough to drive the focus or the fine tracking servo coil, can be provided. However, either of NPN and PNP TRs is working or under ON condition while the remaining TR is under switched (OFF) condition. The bipolar TR turning on or off seems to have an insensible condition which is not suitable to the continuity or linearity.

The complementary emitter followers 8 can therefore be substituted by the present circuit as exemplified in FIG. 17 (the operational amplifiers 20' in FIGS. 17, 20 and 21 are the same component). The advantage of the substitution is to speed up the searching time and to lead to better quality sound. Such a substitution may be effected for a compact disc player, laser video player, magneto-optic recording system, magnetic disc system, a driver for a loudspeaker or any other application utilizing complementary emitter followers.

The operative characteristics of FIG. 17 are identical to that of the prior art except that the focus or fine tracking coil seems to be driven without switching condition of the NPN or PNP TR. Therefore, at least a small electric current seems to be supplied to the base of the NPN or PNP TR at any time. Superior continuous proportional linearity will be obtained because the bipolar TR such as NPN and PNP TRs is assumed to be an electric current gain element, that is, the base current causing the emitter or collector current to generate with constant ratio.

The searching time contains mechanical transferring time for radial movement to the track containing the data to be searched, and data read time for reading the data at the corresponding track on the rotating disc. If the CD player misreads the data at the corresponding track, the microcomputer and its program will try to read the data after one rotation of the disc rotating under 500 to 200 rpm until the data is completely read. The circuit of FIG. 17 will read the data with one or two tries while that of the prior art will have many tries, for example, five tries to read the data. As the searching time of the prior art having five tries is standard and the mechanical transferring time deems to be the same, the circuit of FIG. 17 will gain the searching time corresponding to 4 to 3 rotations of the rotating disc in conjunction with the microcomputer system. In fact, the searching time with the improved DCD-1610 was faster than that of the original DCD-1610.

Figure 22:
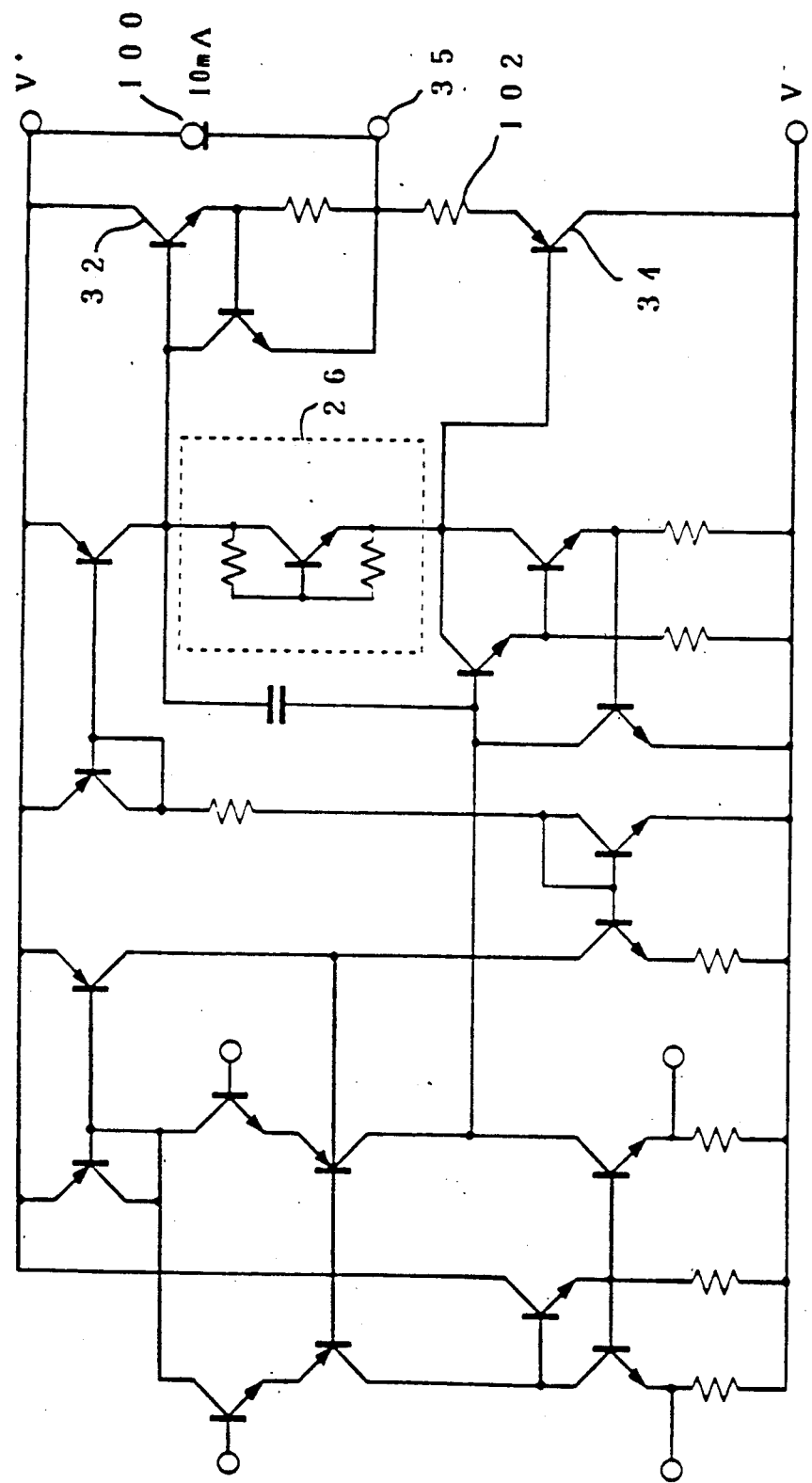
FIG. 22 is a schematic diagram of a power amplifier in accordance with another embodiment of the present invention.

FIG. 22 shows a high performance operational amplifier which may be used as a voltage follower in accordance with the prior art (e.g., as is made by Fairchild Semiconductor μA741), except as concerns the added constant current element 100 with connection line between the output terminal 35 and +Vcc terminal. The constant current element 100 may be the same type as the constant current diode 56 or 88 but for 10 milliamps.

This prior art circuit includes a SEPP output stage 30 with an NPN transistor 32 for providing source current to the output terminal 35 and a PNP transistor 34 for providing sink current to the output terminal 35. There is also a constant voltage circuit 26 for maintaining constant the base to base voltage of the NPN and PNP transistors 32, 34 within the SEPP output stage.

In the absence of the constant current element 100, the prior art circuitry experiences a switching effect between the source and sink currents as the current varies through the constant voltage circuit 26, i.e., transistor 32 switches from the On state to the Off state as transistor 34 switches from the Off state to the On state. This switching creates distortion in the signal at the output terminal 35 each time switching is effected.

Surprisingly, this switching effect is avoided in accordance with the present invention by adding the constant current element 100, which is in parallel to the NPN transistor 32 to bypass idle current and keep the NPN transistor in an Off state at all times which otherwise arise from switching between source and sink currents when there is a voltage change, for instance, across resistor 102, which arises from changes in the sink current. Similarly, the constant current element 100 could be provided in parallel to the PNP transistor 34 to keep the PNP transistor in the Off state at all times to thereby eliminate distortion which otherwise arises from switching between source and sink currents. It is also possible to provide a constant current element in parallel to each of the PNP and NPN transistors.

This constant current element may also be arranged in a line extending between output terminal 35 of FIG. 1 to the positive or negative Vcc voltage supply terminal to maintain the respective transistor 32, 34 in an Off state and thereby avoid switching between sink and source currents from taking place in a similar manner.

Another example of a prior art amplifier circuit includes a National Semiconductor monolithic JFET input operational amplifier LF155/LF156/LF157, in which the constant voltage source is a constant voltage diode. Another example is a Signetics 5532 high performance dual low-noise operational amplifier in which the constant voltage source is an NPN transistor and a diode, which is in series with a resistor (alternatively, a PNP transistor may be employed instead of the NPN transistor). The base of this NPN transistor is connected between the diode and the resistor. In both of these circuits, avoidance of signal distortion at the output terminal due to switching effects is available in the same manner as previously discussed by arranged a constant current element connected between the output terminal and one of the positive and negative voltage supply terminals and in parallel to the transistor which provides either the source current or sink current to the output terminal.

While the foregoing description and drawings represent the preferred embodiments of the present invention, it will be understood that various changes and modifications may be made without departing from the spirit and scope of the present invention.

What is claimed is:

1. An amplifier, comprising:
   an input stage having an inverting input terminal and a non-inverting input terminal;
   a voltage amplifier stage operatively connected to said input stage and having first and second relay terminals;
   a SEPP output stage including an NPN transistor having a base connected to said first relay terminal and an emitter connected to one end of a first resistor, an output terminal connected to another end of said first resistor and to one end of a second resistor, and a PNP transistor having a base connected to said second relay terminal and an emitter connected to another end of said second resistor;
   a second PNP transistor having an emitter connected to said first relay terminal, a collector connected to said second relay terminal and a base connected to said another end of the second resistor via a resistor; and
   a capacitor connected between the base and the emitter of said second PNP transistor, said second PNP transistor being free of direct connection with said output terminal.

2. An amplifier as in claim 1, further comprising:
   a constant-current element in electrical connection between a positive power supply and said voltage-controllable constant current bias circuit.

3. An amplifier as in claim 2, wherein said constant-current element is a P-channel field effect transistor that is serially connected to a resistor.

4. An amplifier as in claim 2, further comprising:
   an auxiliary constant-current circuit which includes another transistor operatively connected between said first and second relay terminals.

5. An amplifier as in claim 4, wherein said another transistor is one of thermo-coupled dual field effect transistor.

6. An amplifier as in claim 1, wherein a high-cut filter comprises said capacitor and said resistor and has a filter common, further comprising:
   means for adversely charging said capacitor, interposed between said filter common and a base of said NPN transistor, so as to avoid generating a rush current in said NPN and PNP transistors.

7. An amplifier as in claim 6, said adversely charging means comprising:

a constant voltage element between said filter common and a base of said PNP transistor.

8. An amplifier as in claim 6, said adversely charging means comprising:
a constant voltage element between said filter common and a base of said NPN transistor; and
a constant current element between said filter common and a negative power supply.

9. An amplifier, comprising:
an input stage having an inverting input terminal and a non-inverting input terminal;
a voltage amplifier stage operatively connected to said input stage and having first and second relay terminals;
a SEPP output stage including a first transistor having a gate connected to said first relay terminal and a source connected to one end of a first resistor, an output terminal connected to another end of said first resistor and to one end of a second resistor, and a second transistor having a gate connected to said second relay terminal and a source connected to another end of said second resistor, said second transistor having a polarity opposite to said first transistor; and
a voltage-controlled constant current bias circuit connected between said first and second relay terminals and controlling a value of the constant current flowing through said first and second relay terminals in response to a control voltage that is a mean value of a voltage between said one end of the first resistor and said another end of the second resistor via a high-cut filter, said voltage-controlled constant current bias circuit being free of direct connection with said output terminal.

10. An amplifier as in claim 9, wherein said voltage-controlled constant current bias circuit comprises a junction type field effect transistor having a drain connected to one of said first and second relay terminals.

11. An amplifier, comprising:
an input stage having an inverting input terminal and a non-inverting input terminal;
a voltage amplifier stage operatively connected to said input stage and having first and second relay terminals;
a SEPP output stage including a first transistor having a base connected to said first relay terminal and an emitter connected to one end of a first resistor, an output terminal connected to another end of said first resistor and to one end of a second resistor, and a second transistor having a base connected to said second relay terminal and an emitter connected to another end of said second resistor, said second transistor having a polarity opposite to said first transistor; and
a voltage-controlled constant current bias circuit connected between said first and second relay terminals and controlling a value of the constant current flowing through said first and second relay terminals in response to a control voltage that is a mean value of a voltage between said one end of the first resistor and said another end of the second resistor via a high-cut filter, said voltage-controlled constant current bias circuit comprising a junction type field effect transistor having a drain connected to one of said first and second relay terminals.

12. An amplifier as in claim 11, further comprising:
an on-off controllable constant voltage bias circuit having a third transistor with a collector connected to said first relay terminal and an emitter connected to said second relay terminal, a third resistor connected to said first relay terminal and a base of said third transistor, and a fourth resistor connected to said base of said third transistor;
a delay circuit for delaying transmission of a signal for a predetermined period after turning on the power supply; and
an isolator for turning off said on-off controllable constant voltage bias circuit in response to receipt of said signal from said delay circuit, said isolator being in electrical connection with both of said third transistor and said delay circuit.

13. An amplifier as in claim 12, wherein said isolator includes a photo-coupler and a photo-transistor, said photo-coupler having an anode connected to a terminal of said delay circuit and a cathode connected to a ground, said photo-transistor having a collector and an emitter connected to the base and the emitter of said third transistor respectively, said delay circuit including a monostable multivibrator.

14. An amplifier as in claim 12, wherein said on-off controllable constant voltage bias circuit is in parallel electrical connection with said voltage-controllable current bias circuit.

15. An amplifier as in claim 12, wherein said voltage-controllable constant current bias circuit includes two transistors, further comprising:
a capacitor in electrical connection between two terminals, said two terminals being respectively in electrical connection with bases of said two transistors, said two terminals also being in electrical connection respectively between said first resistor and said first transistor and between said second resistor and said second transistor.

16. An amplifier as in claim 11, wherein said high-cut filter includes a capacitor, further comprising:
means for changing a rate for charging of said capacitor, said changing means including a resistor in parallel between a filter input and a filter output of said high-cut filter, and having a lower resistance than that of said high-cut filter, said changing means including a break contact serially connected to said resistor that has said lower resistance.

17. An amplifier as in claim 11, further comprising:
means for limiting rush emitter currents through said first and second transistors, said limiting means including a first make contact between a positive power supply and a collector of said first transistor of said SEPP output stage, said limiting means also including a second break contact between a negative power supply and a collector of said second transistor of said SEPP output stage.

18. An amplifier as in claim 11, further comprising:
means for limiting rush emitter currents through said first and second transistors, said limiting means also including third and fourth resistors in parallel with said first and second resistors respectively, said third and fourth resistors having a lower resistance than that of said first and second resistors respectively, said limiting means further including a first make contact being in electrical connection with said third resistor, said limiting means including a second make contact being in electrical connection with said fourth resistor.

19. An amplifier as in claim 11, wherein said high-cut filter includes a capacitor, further comprising:

means for adversely charging said capacitor, interposed between a filter common of said high-cut filter and one of said first and second resistors, so as to avoid generating a rush current in said first and second transistors, said adversely charging means including a power source serially connected to said capacitor.

20. Am amplifier comprising:
an input stage having an inverting input terminal and a non-inverting input terminal;
a voltage amplifier stage operatively connected to said input stage and having first and second relay terminals;
a SEPP output stage having first and second transistors operatively connected to said first and second relay terminals respectively, first and second resistors operatively connected to said first and second transistors respectively, and an output terminal connected to said first and second resistors;
a voltage-controlled constant current bias circuit connected between said first and second relay terminals for controlling a bias current flowing in said first and second resistors via a high-cut filter, said voltage-controllable constant current bias circuit being free of direct connection with said output terminal;
said high-cut filter including a capacitor; and
means for adversely charging said capacitor, interposed between a common of said high-cut filter and one of said first and second resistors, so as to avoid generating a rush current in said first and second transistors.

21. An amplifier as in claim 20, said adversely charging means comprising:
a constant voltage element between said filter common and one of said first and second resistors; and
a constant current element between said filter common and one of the relay terminals.

22. An amplifier as in claim 20, said adversely charging means comprising:
a constant voltage element between said filter common and one of said first and second resistors; and
a constant current element between said filter common and one of said positive and negative power supplies.

23. An amplifier, comprising:
an input stage having an inverting input terminal and a non-inverting input terminal;
a voltage amplifier stage operatively connected to said input stage and having first and second relay terminals;
a SEPP output stage having an output terminal and means for providing source and sink current to said output terminal;
positive and negative supply terminals in electrical connection with said SEPP output stage;
a constant voltage bias circuit connected between said first and second relay terminals for maintaining a voltage constant within said SEPP output stage; and
a constant current element connected between the output terminal and at least one of said voltage supply terminals for preventing switching between said source and sink current of said SEPP output stage from arising.

24. An amplifier as in claim 23, wherein said providing means includes first and second transistors connected to said output terminal, said constant voltage bias circuit maintaining constant a base to base voltage of said first and second transistors.

25. An amplifier as in claim 23, wherein said providing means includes a first transistor and a diode each connected to said output terminal, said constant voltage bias circuit maintaining constant a base to cathode voltage of said first transistor and said diode.

* * * * *